(12) United States Patent
Gonsalves

(10) Patent No.: US 7,008,749 B2
(45) Date of Patent: Mar. 7, 2006

(54) HIGH RESOLUTION RESISTS FOR NEXT GENERATION LITHOGRAPHIES

(75) Inventor: Kenneth E. Gonsalves, Concord, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 437 days.

(21) Appl. No.: 09/992,560

(22) Filed: Nov. 5, 2001

(65) Prior Publication Data

US 2002/0182541 A1 Dec. 5, 2002

Related U.S. Application Data

(60) Provisional application No. 60/274,719, filed on Mar. 12, 2001.

(51) Int. Cl.
| | |
|---|---|
| G03C 1/73 | (2006.01) |
| G03F 7/039 | (2006.01) |
| G03F 7/20 | (2006.01) |
| G03F 7/30 | (2006.01) |
| C08F 30/08 | (2006.01) |
| C08F 28/02 | (2006.01) |

(52) U.S. Cl. .................. 430/270.1; 430/905; 430/910; 430/325; 430/326; 430/311; 430/319; 430/942; 430/914; 430/921; 430/966; 430/925; 526/279; 526/286; 526/287; 526/326

(58) Field of Classification Search ............. 430/237.1, 430/296, 9, 270.1, 286.1, 311, 322, 323, 966, 430/967, 914, 921, 925, 288.1, 18, 942, 313, 430/905, 907, 910, 281.1, 319, 325, 326, 430/945
See application file for complete search history.

(56) References Cited

U.S. PATENT DOCUMENTS

| | | | | |
|---|---|---|---|---|
| 3,849,137 A | * | 11/1974 | Barzynski et al. | 96/67 |
| 4,225,664 A | * | 9/1980 | Moran et al. | 430/306 |
| 4,717,513 A | | 1/1988 | Lewis et al. | |
| 5,459,021 A | * | 10/1995 | Ito et al. | 430/527 |
| 5,780,201 A | | 7/1998 | Sabnis et al. | |
| 5,945,250 A | * | 8/1999 | Aoai et al. | 430/270.1 |

(Continued)

FOREIGN PATENT DOCUMENTS

| | | | |
|---|---|---|---|
| JP | 10-221852 | * | 8/1998 |
| JP | 2000-334881 | * | 12/2000 |

OTHER PUBLICATIONS

English abstract for JP 2000-334881 (Kita et al) provided by Japan patent office, 2000.*

(Continued)

*Primary Examiner*—Sin J. Lee
(74) *Attorney, Agent, or Firm*—Kilpatrick Stockton LLP; J. Clinton Wimbish

(57) ABSTRACT

The present invention provides new high resolution resists applicable to next generation lithographies, methods of making these novel resists, and methods of using these new resists in lithographic processes to effect state-of-the-art lithographies. New nanocomposite resists comprising nanoparticles in a polymer matrix are provided in this invention. New chemically amplified resists that incorporate inorganic moieties as part of the polymer are presented herein, as are new chemically amplified resists that incorporate photoacid generating groups within the polymeric chain. Novel non-chemically amplified yet photosensitive resists, and new organic-inorganic hybrid resists are also provided herein. This invention and the embodiments described herein constitute fundamentally new architectures for high resolution resists.

75 Claims, 3 Drawing Sheets

U.S. PATENT DOCUMENTS

| | | | |
|---|---|---|---|
| 5,965,325 A * | 10/1999 | Matsuo et al. | 430/287.1 |
| 6,232,034 B1 | 5/2001 | Kasai et al. | |
| 6,306,556 B1 | 10/2001 | Matsuo et al. | |
| 6,391,471 B1 * | 5/2002 | Hiraoka et al. | 428/623 |
| 6,420,084 B1 * | 7/2002 | Angelopoulos et al. | 430/270.1 |
| 6,468,717 B1 * | 10/2002 | Kita et al. | 430/278.1 |
| 6,468,725 B1 * | 10/2002 | Takamuki | 430/496 |
| 6,479,210 B1 * | 11/2002 | Kinoshita et al. | 430/270.1 |
| 6,492,086 B1 * | 12/2002 | Barclay et al. | 430/270.1 |
| 6,512,081 B1 * | 1/2003 | Rizzardo et al. | 528/340 |
| 6,517,958 B1 * | 2/2003 | Sellinger et al. | 428/690 |
| 6,696,148 B1 * | 2/2004 | Seino et al. | 428/331 |
| 6,716,919 B1 * | 4/2004 | Lichtenhan et al. | 525/101 |
| 2003/0146418 A1 * | 8/2003 | Chacko | 252/511 |

OTHER PUBLICATIONS

Wu et al (Chemical Absatract for "Polymer-Inorganic High Contrast and High Sensitivity Resists for Nanolithography", Materials Research Society Symposium Proceedings, 584, p. 121-128, 2000).*

Pyun et al (Chemical Abstract for "Synthesis of Organic/Inorganic Hybrid Materials from Polysiloxane Precursors Using Atom Transfer Radiacal Polymerization", Polymer Preprints, 40(2), p. 454-455, 1999).*

Haddad et al ("Hybrid Organic-Inorganic Thermoplastics: Styryl-Based Polyhedral Oligomeric Sisesquioxane Polymers", Marcomolecules, 1996, vol. 29, p. 7302-7304.*

Gonsalves et al ("High Resolution Resists for Next Generation Lithography: The Nanocomposite Approach", Materials Researc Society Symposium Proceedings (2001), vol. 636 (2000 Fall Meeting Proceedings (Nov. 27, 2000-Dec. 1, 2000).*

Chem. Abstract for JP 10-221852 (Aogo et al)—Access No. 1998:545694.*

Kenneth E. Gonsalves et al., "Combinatorial approach for the synthesis of terpolymers and their novel application as very-high-contrast resists for x-ray nanolithography," J. Vac. Sci. Technol. B 18(1), Jan./Feb. 2000, pp. 325-327.

Younqi Hu, et al., "Nanocomposite resists for electron beam nanolithography," Microelectronic Engineering 56 (2001), pp. 289-294.

Henpeng Wu, et al., "Incorporation of polyhedral oligosilsesquioxane in chemically amplified resists to improve their reactive ion etching resistance," J. Vac. Sci. Technol. B 19(3), May/Jun. 2001, pp/851-855.

Henpeng Wu, et al., "Synthesis and Characterization of Radiation-sensitive Polymers and Their Application in Lithography," Ph.D. dissertation, University of Connecticut, Apr. 2001.

L. Merhari, et al., "Nanocomposite resist systems for next generation lithography," Microelectronic Engineering (2002), article in press.

John Canning, "Next generation Lithography: When, why, and at what cost?" Microelectronic Engineering (2002), article in press, abstract only.

Robert L. Brainard, "Resists for next generation lithography," Microelectronic Engineering (2002), article in press.

Satoshi Saito, "A new positive electron-beam resist material composed of catechol derivatives," Microelectronic Engineering (2002), article in press.

Henpeng Wu, et al., "Preparation of a Photoacid Gerating Monomer and its Application in Lithography," Advanced Functional Materials, 11(4), Aug. 2001, pp. 271-276.

Henpeng Wu, et al., "A Novel Single-Component Negative Resist for DUV and Electron Beam Lithography," Advanced Functional Materials, 13(3), Feb. 2001, pp. 195-197.

* cited by examiner

HIGH RESOLUTION RESISTS FOR NEXT GENERATION LITHOGRAPHIES

PRIOR RELATED U.S. APPLICATION DATA

This application claims priority to U.S. provisional application Ser. No. 60/274,719, filed Mar. 12, 2001.

STATEMENT OF GOVERNMENT LICENSE RIGHTS

This invention was made through the support of the National Science Foundation (Grant No. DMR 9902944), and the Department of Defense (Defense Advanced Research Projects Agency Grant No. N66001-00-1-8903). The Federal Government may retain certain license rights in this invention.

TECHNICAL FIELD OF THE INVENTION

The present invention provides new high resolution resists applicable to next generation lithographies, methods of making these novel resists, and new lithographic processes using these resists to effect state-of-the-art lithographies. New nanocomposite resists, new chemically amplified resists that incorporate inorganic moieties and photoacid generating groups, new non-chemically amplified yet photosensitive resists, and new organic-inorganic hybrid resists are described herein. This invention and the disclosed embodiments constitute fundamentally new architectures for high resolution resists.

BACKGROUND OF THE INVENTION

Within the next decade the microelectronic industry will require a lithographic process capable of mass-producing integrated circuits with sub-70 nanometer (nm) critical dimensions (see: L. R. Harriott, *Materials Today* 2, 9 (1999)). This formidable challenge is unlikely to be achieved by evolutionary steps. Extreme UV (EUVL), X-ray (XRL), electron beam (EBL) and ion beam (IBL) lithographies therefore have emerged as more promising candidates for next generation nanofabrication than standard photolithographies, because the shorter the radiation wavelength employed in the lithographic process, the finer the theoretical resolution.

In order to fully exploit these next generation, sub-100 nm lithographic exposure tools, it is essential to develop compatible, next generation resists—i.e. imaging or recording media—that are capable of accommodating the higher resolutions these new exposure tools provide. Such a resist material would need to achieve high sensitivity, high contrast, high resolution and high plasma etch resistance for pattern transfer to a substrate.

A principal example of the disparity between state-of-the-art exposure tools and presently available recording media is seen in electron beam lithography. Although instrumentation for electron beam exposure is capable of sub-100 nm resolution, current resists for recording these exposure patterns suffer from electron proximity effects, which result in resist degradation well beyond the area of actual exposure. Accordingly, this invention provides not only new resists for electron beam lithography, but also new resists adaptable to many short wavelength lithographic methods for higher-resolution, next generation nanofabrication.

SUMMARY OF THE INVENTION

The present invention addresses many of the current limitations in next generation lithographic techniques by providing new resists that achieve high sensitivity, high contrast, high resolution and high plasma etch resistance for pattern transfer to a substrate. These goals are achieved through a variety of new resist architectures that incorporate new functional components into resist polymer matrices in novel ways.

Of all the lithographic technologies for sub-100 nm patterning, electron beam lithography (EBL) is considered the paradigm for next generation lithography, as it is perhaps the most versatile technique benefiting from research and development knowledge accumulated over the past several decades. However, unlike ion beam lithography, EBL suffers from a serious intrinsic problem, namely electron proximity effects which stem from polymer/electron interactions at the molecular level. These effects arise from secondary electrons that induce severe degradation of the pattern definition, as the uniform exposure of the resist by the incident electron beam gives rise to a non-uniform distribution of actual exposure in the pattern writing area. During the past two decades, attempts have been made to decrease the electron proximity effects (see, for example: A. N. Broers, *IBM J Res. Develop.* 32, 502 (1988)) but no significant breakthrough has been achieved.

A similar intrinsic problem arises using extreme ultraviolet lithography (EUVL), viz. the generation of photoelectrons in the polymeric resist. These photoelectrons, like the secondary electrons in electron beam resists, induce resolution degradation due to the off-axis pathways of photoelectrons. What is needed is an alternative approach to resist materials that can drastically reduce the electron proximity effects without requiring the modification of current EBL or EUVL exposure machines.

Projection optical lithography at 157 nm ("157 nm lithography") also requires a fundamental examination of resist compatability with the excimer laser radiation utilized by this method. What is needed is a way to improve the etch resistance, high temperature stability, pattern collapse and line-edge roughness in resists that are compatible with this method, while maintaining the optical transparency that is required at this wavelength.

Two primary types of resist polymers that have been investigated in recent years are the chain-scission resists designed for EBL, and the chemically amplified (CA) resists designed for both EBL and photolithographies. Upon irradiation of a chain-scission resist film with an electron beam, the molecular weights of the polymers in the exposed regions are decreased via chain scission reactions arising from the irradiation. As a result, solubility differentiation is achieved between the exposed and the unexposed regions. The CA resists achieve solubility differentiation based on an acid-catalyzed deprotection reaction which changes the polarity of the polymer in the exposed region. A typical CA resist formula consists of a matrix polymer and a photoacid generator (PAG). Upon irradiation with an electron beam or extreme UV radiation, the PAG generates a strong acid that catalyzes the deprotection reaction.

Several classes of PAGs have been used in CA resists, including ionic PAGs such as sulfonium and ionium salts, as well as nonionic PAGs. However these PAGs are almost exclusively used in their monomeric forms, and small molecule PAGs typically exhibit limited compatibility with the resist polymer matrix. As a result, problems such as phase separation, non-uniform acid distribution, and non-uniform acid migration occurring during temperature fluctuations (e.g. variation in baking processing) may arise. Such limitations frequently lead to an undesirable, premature and non-uniform deprotection reaction in the CA resist film. It would be desirable to develop a fundamentally new way of adding PAGs into a resist polymer to alleviate these problems.

Typically, both the chain-scission resists and the chemically amplified (CA) resists are polymeric organic materials. While it is generally believed that CA resist concept offers the best strategy for advancements in resist technology in optical lithography, EBL and XRL, pure organic resists have generally posed certain deficiencies. For example, etch resistance, high temperature stability, pattern collapse, line-edge roughness, and other problems can limit the applicability of organic resists. Some resist technologies have relied upon inorganic materials to address these limitations. For example, inorganic resists such as silica and metal halides are generally not subject to the secondary electron degradation effects. However, patterning at high doses and the difficulty in inorganic resist coating have hampered their applications. Additionally, while it has been demonstrated that inorganic resists are capable of exhibiting a higher contrast than standard organic resists, their intrinsic lower sensitivity and complex deposition methods make them more suitable for ion beam lithography than for electron beam lithography. It would be advantageous to develop new resists that combined, to the extent possible, the most desirable properties of organic resists with those of the inorganic resists.

One of the more successful CA resists developed in recent years has been a chemically amplified (CA) resist using tert-butyl methacrylate (TBMA) as deblocking component. (See, for example: G. M. Wallraff and W. D. Hinsberg, *Chem. Rev.* 99, 1801 (1999).) This methacrylate-based resist, designed for photolithography, has high resolution and sensitivity, however it lacks the plasma etch resistance required for subsequent pattern transfer to the substrate. What is needed is a way to incorporate the advantages of those inorganic systems into methacrylate-based CA resist systems, in order to improve the plasma etch resistance of the resist for enhancing its utility.

Although the CA resist concept may offer the best strategy for future advancements in resist technology in certain types of lithography, the very nature of an acid-catalyzed deprotection pathway gives rise to inherent problems such as acid diffusion and post-exposure instability. To address these problems, it would be desirable to design and develop resists that are directly sensitive to radiation without utilizing the concept of chemical amplification. Such a resist would desirably achieve the high sensitivity necessary to meet the requirements for high throughput.

Therefore, it has become imperative to address these current limitations in lithography by providing new resists that afford the high sensitivity, high contrast, high resolution and high plasma etch resistance. These resists would also seek to take full advantage of the next generations lithographic irradiation sources, including EBL and EUVL, by reducing the electron proximity effects without requiring the modification of current EBL or EUVL exposure machines. Some of the desired resists would, to the extent possible, combine the advantages and most desirable properties of organic resists with those of inorganic resists. In addition, next generation methacrylate-based CA resist systems would seek fundamentally new architectures that afforded enhanced plasma etch resistance and improved pattern transfer to the substrate. New CA resists need to be engineered to provide novel ways to incorporate and extend the compatibility of small molecule PAGs with the resist polymer matrix. Moreover, next generation resists that are directly sensitive to radiation without utilizing the concept of chemical amplification would be sought.

Accordingly, the present invention provides these novel alternative approaches to high resolution resists applicable to next generation lithographies. In one embodiment, an nanoparticle modified ZEP520® nanocomposite resist has been designed and engineered to drastically reduce the electron proximity effects without modifying current electron beam lithography machines. By incorporating a nanoparticle—particularly nanoparticle-size inorganic materials (e.g. $SiO_2$) or inorganic molecular clusters (e.g. $Si_8O_{12}R_8$)—into a nanocomposite, the reactive ion etch (RIE) resistance of these new resists is also improved.

This invention also provides new ways to impart greater plasma stability to CA resists, including fundamentally new ways to synergistically combine organic and inorganic resist designs. In one embodiment, methacrylate-based CA resists that incorporate inorganic clusters of polyhedral oligosilsesquioxane (POSS) into the side chains are provided. By making the inorganic cluster a component of the polymer, properties such as RIE resistance, pattern stability, and temperature stability of the resists are improved.

The present invention also affords fundamentally new ways to enhance the compatibility of PAGs with the resist polymer matrix. In one embodiment, new resist samples are prepared by co-polymerization of a PAG component with various methacrylate compounds, even at high PAG loading levels. This new resist architecture makes the PAG moiety an actual modular unit within the resist polymer, thereby directly addressing the limited compatibility of monomeric PAGs with the resist polymer matrix. By doing so, problems of phase separation and non-uniform acid distribution frequently observed for CA resists containing a high percentage of monomeric PAGs are substantially eliminated.

In addition, the present invention provides new resist materials that, while highly sensitive to UV radiation, function as non-chemically amplified resists. This resist design is accomplished by providing homopolymers that are prepared from PAG compounds, and does not require co-polymerization with CA resists.

The present invention also addresses one of the fundamental problems of projection optical lithography at 157 nm, namely improving the etch resistance and pattern stability in a suitable resist, while maintaining the optical transparency required at this wavelength. This goal is accomplished by incorporating inorganic clusters of polyhedral oligosilsesquioxanes (POSS) into the polyacetal polymers, using components with substituents and side chains that are transparent at this wavelength.

Accordingly, one aspect of the present invention is to provide new resists with increased resolution and improved pattern definition over currently available resist materials such as pure poly(α-chloroacrylate-co-α-methyl styrene) (ZEP520®).

Another aspect of this invention is to reduce the proximity effects and thereby provide better resolution in electron beam lithography, extreme ultraviolet lithography, etc., over that currently available using resist materials such as pure ZEP520®.

One additional aspect of the present invention is to provide a nanocomposite resist comprising a nanoparticle component, especially an inorganic nanoparticle component (e.g. a metal oxide or metal oxide-containing nanoparticle), and a polymer component, methods of making such a resist, and methods of using this resist.

A further aspect of the present invention is to design new resists with improved reactive ion etch (RIE) resistance, without sacrificing resist sensitivity.

Yet another aspect of this invention is the development of novel CA resists that incorporate photoacid generating groups (PAGs) at high loading/high concentration, but do not suffer from the phase separation, non-uniform acid distribution, and non-uniform acid migration problems common among standard CA resists.

An additional aspect of this invention is to provide polymeric chemically amplified resists comprising a methacrylate component, a polyhedral oligosilsequioxane component, and a photoacid generating component.

A further aspect of the present invention is to afford polymeric chemically amplified resists comprising a methacrylate component and a polyhedral oligosilsequioxane component.

Another aspect of this invention is to combine organic and inorganic resist designs by incorporating inorganic clusters, especially polyhedral oligosilsesquioxane (POSS) moieties, into the side chains of methacrylate-based CA resists. Therefore, the present invention addresses the lack of reactive ion etch (RIE) resistance in methacrylate-based CA resists, that is necessary for pattern transfer.

An additional aspect of the present invention is to afford photopolymers that can act as high performance resists without employing chemical amplification, and thereby are free from the inherent problems associated with chemically amplified resists. Another aspect of the invention is providing a polymeric resist comprising a photoacid generating component.

Another aspect of this invention is providing new resists for projection optical lithography at 157 nm ("157 nm lithography") that combine the most useful properties of organic and inorganic resists by incorporating POSS (polyhedral oligosilsequioxane) inorganic clusters into polyacetal linkages.

Further aspects of this invention include providing new lithographic processes utilizing the novel resists of the present invention, as well as providing integrated circuits prepared by these new lithographic process.

These and other features, aspects, objects and advantages of the present invention will become apparent after a review of the following detailed description of the disclosed embodiments.

DETAILED DESCRIPTION OF THE INVENTION

Figure 1:
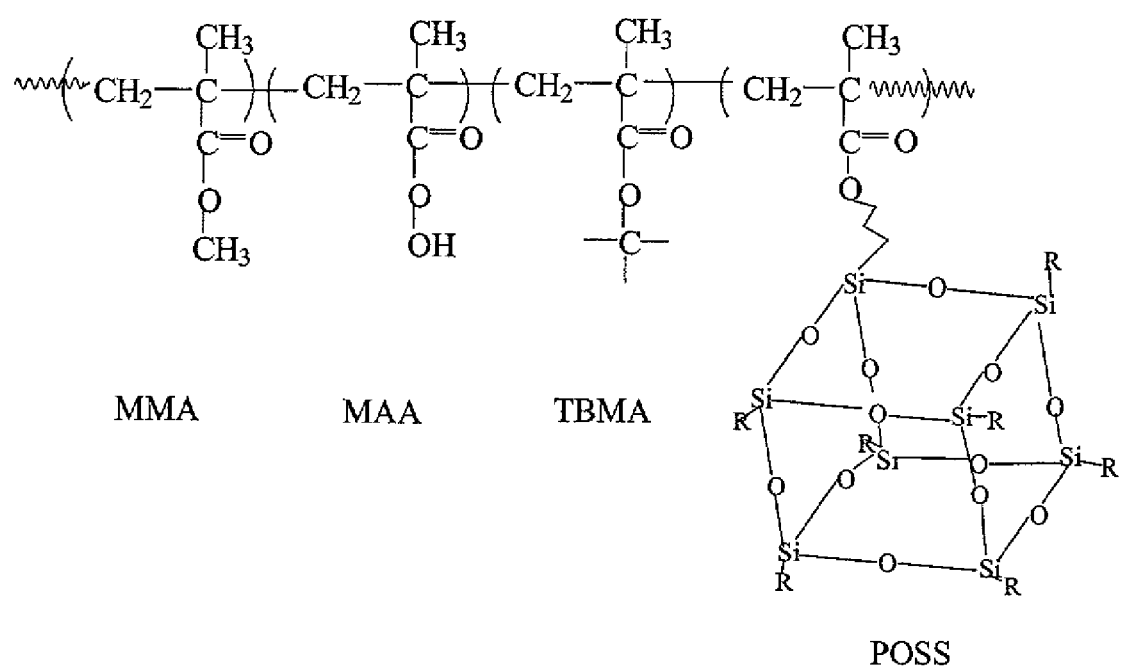
FIG. 1 illustrates the microstructure of a MMA/TBMA/MAA/POSS copolymer of the present invention.

The present invention provides new high resolution resists applicable to next generation lithographies, methods of making these novel resists, and methods of using these resists to effect state-of-the-art lithographies.

Definitions

In order to more clearly define the terms used herein, the following definitions are provided.

A resist, as used herein, refers to the imaging or recording medium, usually a polymeric material, that is used in a lithographic process, typically for the production of integrated circuits. In a general sense, a resist is a material that is used to prevent a particular chemical or physical reaction such as chemical attack, electrodeposition, vapor phase deposition, or other reactions.

Lithography, or a lithographic process, as used herein, refers to a process by which the pattern, typically a pattern of an integrated circuit, is imprinted onto a substrate or a resist. Lithography may be accomplished by exposing a recording medium with radiation of some form, followed by developing the pattern to be used, which results in the removal of either the exposed or the unexposed material. A variety of radiation sources may be used, including but not limited to, ultraviolet (UV) radiation, extreme ultraviolet (EUV) or deep ultraviolet (DUV) radiation, X-rays, electron beams, and ion beams.

A nanocomposite, as used herein, refers to a combination of two or more phases containing different compositions or structures, wherein at least one of these phases is in the nanoscale regime (1–100 nm).

A metal oxide nanoparticle, as used herein, refers to nanometer-sized particles containing oxygen and at least one metal. This definition includes particles of a metal oxide such as $SiO_2$ (silica) or $Al_2O_3$ (alumina) that are nanometer scale (typically 1–100 nm), but also includes discrete molecular clusters that containing oxygen and at least one metal, such as polyhedral oligosilsesquioxanes (POSS). Examples of POSS clusters include, but are not limited to, the series of cubic clusters of the general formula $Si_8O_{12}(OR)_8$ or $Si_8O_{12}R_8$ where R=alkyl, substituted alkyl, cycloalkyl, substituted cycloalkyl, silyl, substituted silyl, aryl, substituted aryl, aralkyl, substituted aralkyl, alkenyl, substituted alkenyl. Other examples of POSS clusters are the polyhedral clusters of the type $Si_{12}O_{18}(OR)_{12}$, or $Si_{12}O_{18}R_{12}$. where R=alkyl, substituted alkyl, cycloalkyl, substituted cycloalkyl, silyl, substituted silyl, aryl, substituted aryl, aralkyl, substituted aralkyl, alkenyl, substituted alkenyl. Whether referring to a metal oxide particle, or a discrete molecular cluster, all of these materials will be described as "metal oxide" nanoparticles. Specifically, "silica nanoparticles" will be used herein to describe both nanoscale $SiO_2$ and nanoscale clusters of the general formula $Si_8O_{12}(OR)_8$, $Si_8O_{12}R_8$, $Si_{12}O_{18}(OR)_{12}$, or $Si_{12}O_{18}R_{12}$.

A mixed oxide, as used herein, describes a single chemical phase in which more than one metal is combined with oxygen to form a single chemical compound. For example, $BaTiO_3$ and $YMnO_3$ represents mixed oxides which are different from mixtures of two oxide compounds, of which an $In_2O_3/SnO_2$ mixture is an example.

A nanoparticle, as used herein, refers to nanometer-sized particles that contain at least one metal or non-metal element as a component. For example, this definition includes, but is not limited to, particles of borides, carbides, silicides, nitrides, phosphides, arsenides, oxides, sulfides, selenides, tellurides, halides (fluorides, chlorides, bromides, or iodides), and combinations thereof. This term also encompasses more complex inorganic species such as a single chemical phase in which more than one metal is combined with an element (e.g. a bimetallic sulfide), a single chemical phase in a metal is combined with more than one other element (e.g. a metal oxycarbide), derivatives thereof, and combinations thereof in nanoparticle form. Therefore, this definition includes particles of inorganic materials such as FeS, NiAs or MnSe that are nanometer scale, but also includes discrete inorganic molecular clusters, e.g. $Na_4Nb_6Cl_{18}$, $W_6Cl_{12}$, salts of $[Mo_6O_{26}]^{4-}$, or the vast range of heteropolyanion-containing compounds of the transition metals. Organometallic nanoparticles such as $Re_3Me_9$ and $Si_8O_{12}R_8$ are also encompassed by this term. Thus, the term "nanoparticle" includes the materials described above by the term "metal oxide nanoparticle", but is not limited to oxygen-containing materials.

Novel Nanocomposite Resists Incorporating Nanoparticles

Nanocomposite resists have previously been reported for performance improvements in etch resistance, thermal resistance and mechanical stability. For example, Ishii demonstrated that a $C_{60}$ incorporated ZEP520® nanocomposite resist could significantly improve the mechanical property of pure ZEP520® resist. (See: T. Ishii, H. Nozawa, T. Tamamura, and A. Ozawa, *J. Vac. Sci. Technol. B* 15, 2570 (1997).)

For electron beam lithography, a more challenging issue is the proximity effect, which fundamentally stems from the molecular level interactions of electrons with polymers. These interactions induce severe degradation of the pattern definition, as the uniform exposure of the resist by the incident electron beam gives rise to a non-uniform distribution of actual exposure in the pattern writing area. The present invention provides a nanoparticle-modified nanocomposite resist. The nanoparticles, which include inorganic materials such as $SiO_2$, $Al_2O_3$ or FeS that are nanometer scale, as well as discrete inorganic molecular clusters, such as $Si_8O_{12}(OSiMe_2CH_2CH_2C_6H_9)_8$ or $Na_4Nb_6Cl_{18}$, are incorporated into a polymer matrix to form the nanocomposite resist.

One feature of the present invention is a metal oxide nanoparticle-modified nanocomposite resist. These nanocomposite resists incorporate nanoparticles of a metal oxide such as $SiO_2$ (silica) and/or discrete molecular clusters such as polyhedral oligosilsesquioxanes (POSS), in a polymer matrix. Example 1 describes the preparative method for one embodiment of this nanocomposite resist employing silica nanoparticles $Si_8O_{12}(OSiMe_2CH_2CH_2C_6H_9)_8$ (Tal Materials, Inc., Ann Arbor, Mich.) in a ZEP520® (poly(α-chloroacrylate-co-α-methyl styrene, Zeon Chemicals L.P., Louisville, Ky.) polymer matrix.

One feature of the POSS silica nanoparticles is the surface-functionalization of the silicon oxide core with alkyl, cycloalkyl, silyl, aryl, aralkyl, or alkenyl groups. Thus, the POSS silica nanoparticles $Si_8O_{12}R_8$ may be surface functionalized with hydrophobic surface groups such as isooctyl, cyclohexyl, cyclopentyl, isobutyl, methyl or phenyl (Hybrid Plastics, Fountain Valley, Calif.), for blending with a ZEP520® copolymer (poly(α-chloroacrylate-co-α-methyl styrene). Similarly, silica nanoparticles that are surface functionalized with hydrophilic groups, such as $Si_8O_{12}(OSiMe_2CH_2CH_2CH_2OH)_8$, $Si_8O_{12}(O^-NMe_4^+)_8 \cdot 60H_2O$, or $Si_8O_{12}(CH_2CH_2CH_2NH_3^+Cl^-)_8$ may be utilized with appropriate hydrophilic polymer matrices. Incorporating mixtures of nanoparticles in a polymer or copolymer matrix is also envisioned in this invention.

It is to be understood that nanoparticles of various metal oxides are also encompassed by this invention, including but not limited to, oxides of silicon, aluminum, titanium, zirconium, iron, antimony, tin, cerium, barium, manganese, vanadium, chromium, lead, copper, indium, yttrium, zinc, mixed oxides thereof, and combinations of oxides thereof. It is also to be understood that other non-oxide nanoparticles are further encompassed by this invention, including but not limited to, borides, carbides, suicides, nitrides, phosphides, arsenides, sulfides, selenides, tellurides, fluorides, chlorides, bromides, iodides, and combinations thereof. Nanoparticles of less than about 100 nanometers (nm) are encompassed by the present invention, but nanoparticles of less than about 10 nm are preferred, nanoparticles of less than about 2 nm are more preferred. Additionally, various polymer matrices are encompassed by this invention, including, but not limited to, poly(α-chloroacrylate-co-α-methyl styrene), poly(2,2,2-trifluoroethyl-α-chloroacrylate), poly(methyl methacrylate), poly(butene sulfone), polysilanes, polyacetals or combinations thereof.

One of the purposes of incorporating nanoparticles into resists was to increase their reactive ion etch (RIE) resistance. Example 2 and Table 1 provide details of the plasma etching rate of a silica nanoparticle-modified ZEP520® at different loadings. Nanocomposites with up to about 50% nanoparticle by weight are encompassed by the present invention, and test data for about 4%, 7%, and 15% by weight of $Si_8O_{12}(OSiMe_2CH_2CH_2C_6H_9)_8$ nanoparticles in ZEP520® are shown in Table 1. As indicated in Table 1, compared with pure ZEP520®, incorporation of $Si_8O_{12}(OSiMe_2CH_2CH_2C_6H_9)_8$ nanoparticles did not increase the etching resistance with $CF_4$. However, replacing $CF_4$ with $O_2$ marginally increased the etching resistance at low loading of silica particles in ZEP520® (about 4 wt %), but at a higher loading the resistance enhancement was significant. The etching rate decreased from 2000 Å/min for ZEP520® to about 100 Å/min for 7 wt % $Si_8O_{12}(OSiMe_2CH_2CH_2C_6H_9)_8$ loaded ZEP520®.

Another function of nanoparticles was aimed at reducing the proximity effect. While not intending to be bound by the following statement, it is postulated that the presence of silica nanoparticles in the polymer not only statistically reduces the lateral range of the incident electrons, but also reduces the lateral energy spread of the secondary electrons due to a "blocking" effect of silica nanoparticles. This postulation is based on the fact that the silica nanoparticles have a higher average atomic number Z than the organic polymer components and therefore, a higher electron stopping power. The combined effects appear to result in a reduction of the proximity effects in the nanocomposite resist.

Differential scanning calorimetry (DSC) was used to examine the compatibility between silica nanoparticles and ZEP520®, as described in Example 3. The DSC results are interpreted based on the assumption that nanoparticles that have strong interactions with the polymer will impart a higher glass transition temperature ($T_g$) to the composite as compared to the pure polymer, as particles can be treated as a crosslinking agent. Otherwise the composite will show a lower $T_g$ as the particles behave as a plasticizer. These DSC experiments indicated that the addition of silica nanoparticles to ZEP520® increased the glass transition temperature of ZEP520® to around 160–170° C. in the composites. However for loadings higher than about 4 wt %, the increase of $T_g$ levelled off, implying that about 4 wt % loading of silica nanoparticles in ZEP520® corresponded to the saturation concentration. When the loading was higher than about 4 wt %, the silica nanoparticles tended to aggregate and under optical microscopy a phase separation was observed. Thus, the compatibility between nanoparticle and polymer at about 4 wt % of silica nanoparticles is an important factor in minimizing line broadening during electron-beam lithography, as indicated by the line edge roughness which was observed when phase separation occurred.

One concern regarding silica nanoparticle incorporation is that they would decrease the sensitivity of the host resist, such as ZEP520.® To investigate this possibility, normalized residual thickness (NRT) curves were measured for both silica incorporated ZEP520® and pure ZEP520® under the identical conditions at 20 keV. This study indicated that incorporation of silica nanoparticles had no significant effect on ZEP520® in terms of sensitivity and contrast. The results of these experiments are presented in Example 4.

Example 5 provides a preliminary assessment of the lithographic performance of the nanocomposite resist, where isolated lines were patterned at 20 keV. It was found that writing lines with the objective of obtaining 60 nm and 40 nm widths in an ca. 400 nm thick nanocomposite film with about 4 wt % silica nanoparticle loading, the actual line widths were 69 nm and 47 nm, respectively.

The compatibility between nanoparticles and ZEP520® in the nanocomposite is an important factor in minimizing line broadening during electron-beam lithography, as indicated by the line edge roughness which was observed when phase separation occurred. Phase separation occurred, as indicated by line edge roughness, in nanocomposite samples of ZEP520® containing 7 wt % silica nanoparticles, by optical microscopy, whereas no phase separation occurred in those nanocomposites with 4 wt % of silica nanoparticles.

It appeared that a 20 keV electron beam did not have sufficient energy to penetrate through 350 nm films for the silica nanoparticle-incorporated ZEP520®, indicated by shallow trenches, therefore higher voltage electron beams, 50 and 100 keV, were studied for both samples. Film thickness was 280 nm for the nanoparticle-incorporated ZEP520®. Clear cross sectional images were obtained at 150 $\mu C/cm^2$ at 50 keV and 210 $\mu C/cm^2$ at 100 keV. The pattern designed for the exposure at 50 keV and 100 keV had a fixed line width of 60 nm with various line spaces of 6 w (6 times the line width), 5 w, 4 w, 3 w, 2 w, 1 w and ½ w. The results of these experiments are presented in Example 6 and indicated that greater pattern stability and close line spacings were easily obtainable in the silica nanoparticle/ZEP520® nanocomposite. For example, at 210 $\mu C/cm^2$ with an electron beam energy of 100 keV, the pattern on silica nanoparticle/ZEP520® nanocomposite gave trenches with a actual width of about 67 nm even when the spacing was as low as 1 w, or 60 nm.

Incorporation of Polyhedral Oligosilsesquioxane (POSS) into Chemically Amplified (CA) Resists The present invention addresses one of the fundamental drawbacks of methacrylate-based CA resists, namely their lack of reactive ion etch (RIE) resistance necessary for pattern transfer, by providing a fundamentally new way to synergistically combine organic and inorganic resist designs. In one embodiment, this invention provides methacrylate-based CA resists that incorporate inorganic clusters of polyhedral oligosilsesquioxane (POSS) into the polymer side chains. Thus, the present invention encompasses a polymeric chemically amplified resist comprising a methacrylate component and a polyhedral oligosilsequioxane component. The methacrylate component is typically a combination of more than one methacrylate compound, and typically is selected from methyl methacrylate, t-butyl methacrylate, methacrylic acid, or combinations thereof, although other methacrylate compounds are included in the present invention. The polyhedral oligosilsequioxane component is typically selected from 3-(3,5,7,9,11,13,15-heptacyclopentyl-pentacyclo-[9.5.1.1$^{3,9}$.1$^{5,15}$.1$^{7,13}$]octasiloxane-1-yl)propyl methacrylate; 3-[(3,5,7,9,11,13,15-heptacyclopentylpentacyclo-[9.5.1.1$^{3,9}$.1$^{5,15}$.1$^{7,13}$]-octasiloxan-1-yloxy)dimethylsilyl]propyl methacrylate; 1,3,5,7,9,11,13-heptacyclopentyl-15vinylpentacyclo-[9.5.1.1$^{3,9}$.1$^{5,15}$.1$^{7,13}$]octasiloxane, or combinations thereof. However, other silica cage compounds that contain polymerizable groups are encompassed by the present invention, as are various other inorganic clusters containing polymerizable groups. For example, there are a number of iron, cobalt, chromium, nickel, molybdenum, tungsten, platinum, palladium, boron, tin, ruthenium, osmium, rhodium, iridium, rhenium, niobium, and tantalum clusters with pendant polymerizable groups that are encompassed by the present invention.

An illustration or schematic of the microstructure of one embodiment, a copolymer containing methyl methacrylate (MMA), t-butyl methacrylate (TBMA), methacrylic acid (MAA), and the polyhedral oligosilsesquioxane, 3-(3,5,7,9,11,13,15-heptacyclopentylpentacyclo-[9.5.1.1$^{3,9}$.1$^{5,15}$.1$^{7,13}$]octasiloxane-1-yl)propyl methacrylate (propyl methacrylate POSS), is presented in FIG. 1. While not wanting to be bound by this statement, it is believed that because this MMA/TBMA/MAA/POSS copolymer incorporates an inorganic moiety, here the POSS moiety with a cluster or cage-like structure, is more etch resistant than organic units without such a moiety. In addition, the silica cage of the POSS unit is surrounded by bulky cyclopentyl groups in this particular propyl methacrylate POSS, which could afford POSS even higher etch resistance.

General details of the preparation of a methacrylate-based CA resist incorporating a polyhedral oligosilsesquioxane (POSS) component are presented in Example 7, and Example 8 describes the characterization of these methacrylate-based CA resists. Table 2 presents the relative weight percents of components loaded into the mixture to be polymerized, and the percent composition of that component in the resulting polymer, for four representative resist samples with various POSS content. Table 2 also presents the glass transition temperatures (Tg), weight-average molecular weights ($M_w$), and polydispersity indices (PDI) of each representative polymer sample.

In one embodiment, the POSS component is incorporated into the CA resist of the present invention from about 1% to about 40% by weight in the polymer, although a POSS content of from about 10% to about 35% by weight in the polymer is preferable. Polymers prepared according to this invention are typically characterized by a glass transition temperature greater than about 165° C. and a weight-average molecular weights ($M_W$) greater than about 100,000 g/mol, although those polymers outside these ranges are encompassed herein.

One primary purpose of incorporating POSS units into the polymer matrix is to increase their reactive ion etch (RIE) resistance, and Example 9 and Table 3 record the polymer etch data for all four representative samples presented in Table 2. As these results indicate, all four samples exhibited a similar etch resistance regardless of their varied POSS contents, in the $CF_4$ plasma tests. One possible explanation for this observation is that the POSS silica cage is not resistant to the $CF_4$ plasma, as suggested by the fact that the Si—F bond is an extremely stable single bond. On the other hand, the POSS unit content is observed to affect the polymers' etch resistance in the $O_2$ plasma. When the POSS content is 12.5 wt %, no RIE enhancement is observed. When this content increases to 22.5 wt %, a significant improvement is observed. Further increase in the POSS units to 30.5 wt % gives a etch rate nearly one-third (⅓) of that measured for the sample containing no POSS units that was used as a reference for the RIE comparison.

An examination of these samples by high resolution transmission electron microscopy (HRTEM) indicated morphology differences in those resists that contained the POSS moieties at different weight percents. While not wanting to be bound by the following statement, it is believed that the morphologies observed by HRTEM are responsible for the different plasma etch behavior of the POSS-containing polymers. Thus, the POSS units in the low-concentration POSS samples appeared to associate to create discrete crystallites with small domain dimensions that would be inefficient to plasma erosion. As the POSS contents increased, the POSS units in the polymer assume a different morphology. In this case, a network of large, rectangular crystallites formed and uniformly distributed within the polymer matrix by association of the silica cages of the POSS units. This network of crystallites is believed to afford efficient protection against the $O_2$ plasma etching.

While not wanting to be bound by the following statement, it is believed that the effectiveness of the POSS units in improving the RIE resistance in the $O_2$ plasma lies in the intrinsic structure of the POSS units, that includes a silica cage and seven cyclopentyl groups around the cage corners. It is well accepted that inorganic molecules generally have higher resistance than organic molecules, and when combined with the steric bulk of the cyclopentyl groups, improved RIE resistance in the $O_2$ plasma results.

The lithographic properties of the POSS-containing samples were also evaluated under UV irradiation at a wavelength of 248 nm, and electron beam irradiation at 20 KeV, in which thin resist films were spin cast onto silicon wafers from PGME solutions. It was observed by exposure experiments that incorporation of this largely inorganic POSS component has not decreased the sensitivity of the resists under electron beam lithography. The imaging experiments are outlined in Example 10.

Finally, it is noted that other POSS components could be incorporated into the methacrylate-based CA resist according to the method of Example 7, as indicated in Example 11. For example, additional POSS components that could be used include, but are not limited to 3-[(3,5,7,9,11,13,15-heptacyclopentyl-pentacyclo-[9.5.1.1$^{3,9}$.1$^{5,15}$.1$^{7,13}$]-octasiloxan-1-yloxy)dimethylsilyl]propyl methacrylate (abbreviated dimethylsilyloxy-(propyl)methacrylate-POSS) and 1,3,5,7,9,11,13-heptacyclopentyl-15vinylpentacyclo-[9.5.1.1$^{3,9}$.1$^{5,15}$.1$^{7,13}$]-octasiloxane (abbreviated vinyl-POSS). In addition, structurally similar POSS compounds, in which the silicon atoms at the corners of the POSS cage are substituted with R groups other than cyclopentyl, could be used in the preparation of methacrylate-based CA resists according to the present invention. Thus, in FIG. 1, POSS components could be used wherein R is selected from alkyl, cycloalkyl, aryl, alkenyl, alkynyl, aralkyl, aralkenyl, heteroalkyl, heterocycloalkyl, substituted derivatives thereof, combinations thereof, or similar substituents.

Chemically Amplified (CA) Resists with Photoacid Generating Groups (PAGs) Incorporated in the Resist Chains To alleviate the problems associated with simply adding monomeric photoacid generating groups (PAGs) into CA resist films outlined above, the present invention incorporates photoacid generating units directly into the polymeric resist chains as part of the polymeric unit.

For these CA resists, tert-butyl methacrylate (TBMA) was used as a protection group, although similarly operable protecting groups could be used. Polyhedral oligosilsequi-oxane methacrylate (POSS) components were incorporated in some samples to achieve higher plasma etch rate required for pattern transfer, however it is to be understood that it is not necessary to incorporate POSS components in this embodiment of the present invention. In addition, silica nanoparticles can be blended in for enhanced etch resistance to provide another embodiment.

A PAG monomer containing a photosensitive sulfonium unit coupled with a vinyl (methacrylate) polymerizable group, viz. [p-CH$_2$=C(CH$_3$)C(O)OC$_6$H$_4$SMe$_2$]OSO$_2$CF$_3$, was synthesized according to Example 12, and shown in the reaction scheme below. The vinyl (methacrylate) polymerizable group was selected to make the PAG monomer compatible with common methacrylate compounds found in CA resists. Resist samples were then prepared by co-polymerization of the PAG component with various methacrylate compounds as indicated in Example 13, with the components and corresponding compositions of representative samples listed in Table 4 and Example 14. The methacrylate component is typically a combination of more than one methacrylate compound, usually selected from methyl methacrylate, t-butyl methacrylate, methacrylic acid, or combinations thereof, although other methacrylate compounds are included herein. The photoacid generating component typically contains a sulfonium group, but other photoacid generating compounds, such as iodonium are encompassed by this invention.

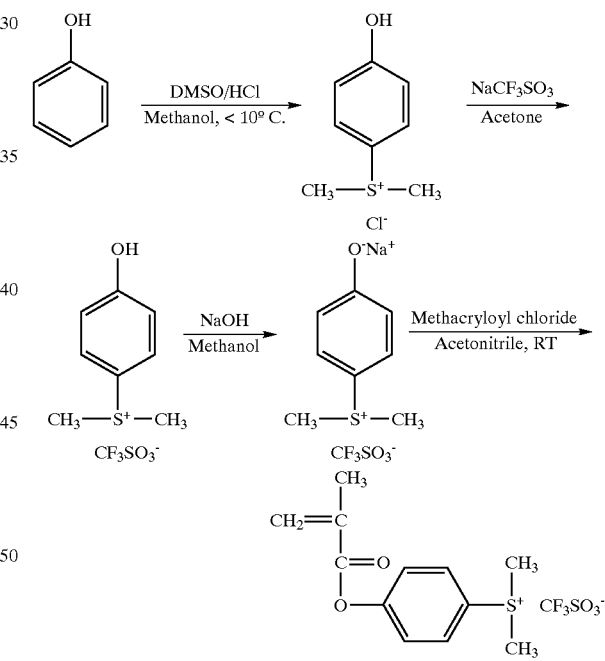

In one embodiment, the chemically amplified resist of the present invention further comprises a dissolution promoter. While a range of promoters are envisioned, itaconic anhydride is one preferred dissolution promoter, which functions effectively in tetramethylammonium hydroxide solutions.

One embodiment of the present invention optionally incorporates a POSS component, according to Example 13. When present, the polyhedral oligosilsequioxane component is typically selected from 3-(3,5,7,9,11,13,15-heptacyclopentylpentacyclo[9.5.1.1$^{3,9}$.1$^{5,15}$.1$^{7,13}$]octasiloxane-1-yl) propyl methacrylate; 3-[(3,5,7,9,11,13,15-heptacyclopentyl-pentacyclo-[9.5.1.1$^{3,9}$.1$^{5,15}$.1$^{7,13}$]-octasiloxan-1-yloxy)

dimethylsilyl]propyl methacrylate; 1,3,5,7,9,11,13-heptacyclopentyl-15-vinylpentacyclo-[9.5.1.1$^{3,9}$.1$^{5,15}$.1$^{7,13}$] octasiloxane, or combinations thereof. However, other silica cage compounds that contain polymerizable groups are encompasses by the present invention.

When present in the chemically amplified resist, the polyhedral oligosilsequioxane component is present from about 1% to about 35% by weight in the polymer, preferably from about 10% to about 32% by weight in the polymer. Additionally, the photoacid generating component is present from about 2% to about 25% by weight in the polymer, preferably from about 5% to about 20% by weight in the polymer. Polymers prepared according to this invention are typically characterized by a weight-average molecular weights (MW) varying from 20,000 to 100,000 g/mol and a polydispersity index between 1 and about 2, although those polymers outside these ranges are encompassed by the present invention.

In one embodiment of this invention, the CA resist comprises methyl methacrylate, t-butyl methacrylate, methacrylic acid, 3-(3,5,7,9,11,13,15-heptacyclopentylpentacyclo-[9.5.1.1$^{3,9}$.1$^{5,15}$.1$^{7,13}$]-octasiloxane-1-yl)propyl methacrylate, and [p-CH$_2$=C(CH$_3$)C(O)OC$_6$H$_4$SMe$_2$]OSO$_2$CF$_3$. In another embodiment, this invention includes a dissolution promoter, and therefore comprises methyl methacrylate, t-butyl methacrylate, methacrylic acid, itaconic anhydride, 3-(3,5,7,9,11,13,15-heptacyclopentylpentacyclo-[9.5.1.1$^{3,9}$.1$^{5,15}$.1$^{7,13}$]octasiloxane-1-yl)propyl methacrylate, and [p-CH$_2$=C(CH$_3$)C(O)OC$_6$H$_4$SMe$_2$]OSO$_2$CF$_3$.

To evaluate the lithographic properties of the resists, thin films were cast on silicon wafers to a typical film thickness of about 0.3 to about 0.5 μm. All resists samples had excellent film formation behavior. No pinholes were observed even with a film thickness of below 100 nm. This observation behavior could be attributed to the absence of phase separation frequently observed for CA resists containing a high percentage of small-molecule PAGs that are not incorporated directly into the polymeric resist chains as part of the polymeric unit.

Table 4 presents the relative weight percents of components loaded into the mixture to be polymerized, and the percent composition of that component in the resulting polymer, for three representative resist samples with various PAG and POSS content. Table 4 also presents the weight-average molecular weights (M$_W$) and polydispersity indices (PDI) of each polymer sample.

Figure 2:
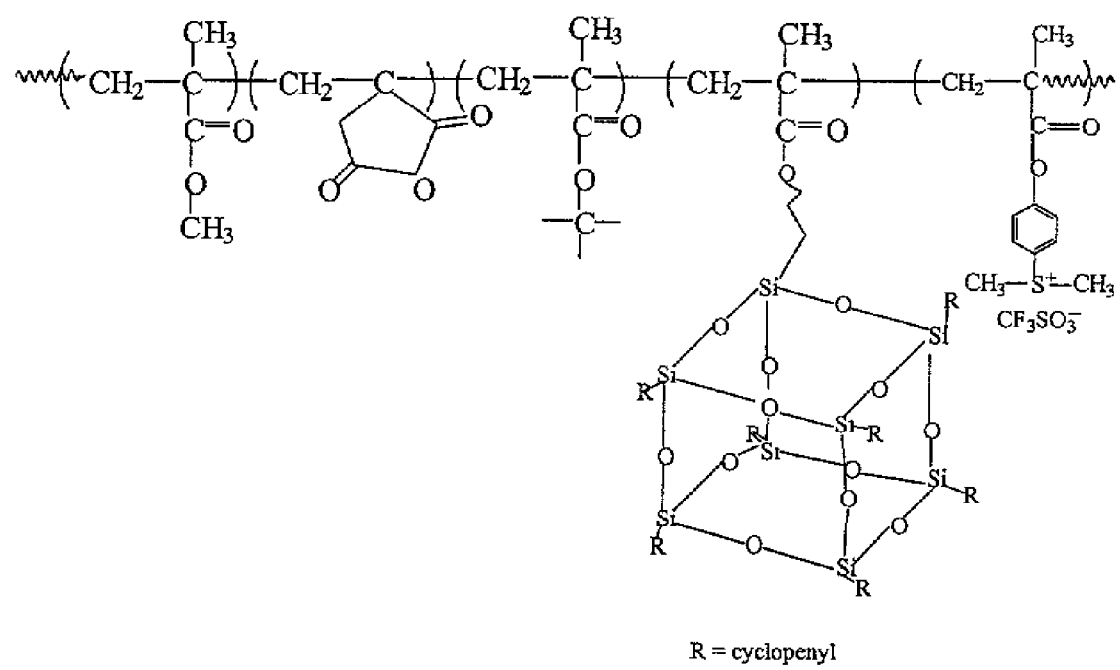
FIG. 2 illustrates the microstructure of a MMA/IA/TBMA/POSS/PAG copolymer of the present invention.

An illustration or schematic of the microstructure of one embodiment of this invention, viz. a copolymer containing methyl methacrylate (MMA), t-butyl methacrylate (TBMA), the polyhedral oligosilsesquioxane propyl methacrylate POSS, itaconic anhydride, and the PAG group [p-CH$_2$=C(CH$_3$)C(O)OC$_6$H$_4$SMe$_2$]OSO$_2$CF$_3$ is presented in FIG. 2.

The resist films of this invention were first exposed on an EX7 DUV 248 nm Excimer Laser stepper at a wavelength of 248 nm. Typical processing conditions are presented in Example 15. High resolution SEM micrographs of patterns obtained for samples at a dose of 5 mJ/cm$^2$ were compared for those samples that incorporated itaconic anhydride and those that did not. Itaconic anhydride (IA) functions as a dissolution promoter in TMAH solutions, and samples containing IA developed properly in either 0.21 or 0.26 N TMAH solutions. In contrast, samples that contained no IA dissolution promoter developed equally well in 0.26 N TMAH, most probably due to high conversion of tert-butyl group into an acid (—COOH) group.

All resist samples had a wide processing window in terms of post-exposure-bake (PEB) temperatures under both 248 nm deep UV and electron beam exposures. A series of PEB temperatures, viz. 110, 120, 125 and 130° C. were applied, while maintaining the other processing parameters the same. The image quality obtained using different PEB temperatures was indistinguishable. Additionally, most samples were found to be relatively insensitive to TMAH concentrations. For example, different TMAH solution concentrations, from about 0.1 N to about 0.26 N, were equally effective for developing sample 13a in Table 4.

The resists were also found to be very sensitive to electron beam radiation. The imaging experiments were carried out on a Leo 982 SEM with a Nabity pattern generator at 20 keV. The processing conditions were almost identical to the photo-exposure at 248 nm. All samples exhibited very high sensitivity under both 248 nm deep-UV and 20 keV electron exposures. It is believed that the high sensitivity is attributable to the high loading of photoacid generator in the resists, which was made possible by incorporation of PAG units in the polymer chains. Without such incorporation directly into the polymer chains, phase separation would otherwise occur at high PAG loading levels.

Tailored Non-Chemically Amplified Resists

To address many of the inherent problems of chemically amplified resist technology, e.g. acid diffusion, post-exposure instability, etc., the present invention encompasses the design and development of resists that are directly sensitive to radiation without utilizing the concept of chemical amplification. These new resist materials, while highly sensitive to UV radiation, function as non-chemically amplified resists. This resist design is accomplished by homopolymers that are prepared from PAG components, and does not require co-polymerization with CA resists.

In order for a polymer to be directly sensitive to radiation, a highly radiation-sensitive group must be introduced into the polymer units. Sulfonium salts have long been found to be sensitive to UV radiation and actually gained wide applications as photoacid generators (PAGs) in CA photoresists. For this reason, sulfonium groups were chosen as radiation-sensitive groups in the non-CA resists described herein. It has been discovered that homopolymers prepared from polymerizable PAG components are highly sensitive to UV radiation and act as non-chemically amplified (non-CA) resist materials.

The homo-polymerization reaction of the PAG component [p-CH$_2$=C(CH$_3$)C(O)OC$_6$H$_4$SMe$_2$]OSO$_2$CF$_3$, initiated by AIBN (α,α'-azobis(isobutyronitrile)), is described in Example 17, and polymer characterization is outlined in Example 18. Exposure at 248 nm was conducted to investigate the lithographic properties of this polymer, Example 19.

The rationale for this polymer to act as a resist was based upon a photochemical study carried out on the polymer. The unexposed polymer was polar, due to its ionic character, and therefore was soluble in polar solvents such as water. Upon exposure to 254 nm deep-UV radiation, the polymer underwent a polarity change, as evidenced by its change in solubility after irradiation. Thus, when irradiated, the sulfur-carbon bonds in the sulfonium groups were cleaved and a free acid was simultaneously generated. The irradiated polymer thereby lost its ionic character, became less polar, and was found to be insoluble in polar solvents. Unexposed portions of the resist film readily dissolved in an aqueous tetramethylammonium hydroxide developer while the exposed regions (patterns) were maintained after dipping the exposed resist film in developer. Thus, SEM micrographs of a negative-tone pattern obtained for this resist by exposure to 248 nm radiation at a dose of 50 mJ/cm$^2$ revealed a feature dimension of approximately 250 nm.

It was also found that this polymer was also very sensitive to electron beam radiation. Imaging experiments were run on a Leo 982 SEM with a Nabity pattern generator at 20 keV. The processing conditions were almost identical to the photo-exposure at 248 nm. Accordingly, SEM micrographs of negative-tone lines obtained for this resist at a dose of 25μ C/cm$^2$ provided line dimensions of approximately 200 nm.

As a non-CA resist, this polymer was characterized with extremely high sensitivity. The doses obtained for this polymer were comparable to those obtained for CA resists, and therefore this polymer can meet the requirements for high throughput. It is speculated that the most probable reasons for its high sensitivity are as follows. It is well established that the degree of sensitivity of a radiation-sensitive compound usually depends on its environment. While the radiation-sensitive groups in such a compound can absorb energy directly from radiation, they usually obtain energy indirectly from a neighboring group by an energy transfer process. Unlike a small molecule compound, the resist reported here has a radiation-sensitive sulfonium groups which constitutes a side chain attached to a polymer backbone. Radiation most likely excites the polymer backbone and then transfers its energy to the sulfonium groups. Therefore, a relatively small amount of energy is sufficient to effect considerable dissociation in the sulfonium groups. Another possible reason lies in the polymer's unique solubility behavior in developing solutions. Destroying only a small portion of ionic sulfonium groups by irradiation, and consequently changing the polarity of the polymer, could bring about such a sharp solubility change in the developing solution.

Incorporation of Polyhedral Oligosilsesquioxanes (POSS) into Polyacetal Resists

The present invention also addresses one of the fundamental problems of projection optical lithography at 157 nm, namely improving the etch resistance and pattern stability in a resist, while maintaining the optical transparency that is required at this wavelength. This invention provides another fundamentally new way to synergistically combine organic and inorganic resist materials to approach this problem, namely, by incorporating POSS (polyhedral oligosilsesquioxane) inorganic clusters into polyacetal linkages.

The advantages of combining the most useful properties of organic and inorganic resists have been examined above. Etch resistance, high temperature stability, pattern collapse, line-edge roughness, and other problems that can limit the applicability of organic resists, are often circumvented by resist technologies using inorganic materials. However, patterning at high doses and the difficulty in inorganic resist coating have hampered their applications. Additionally, while it has been demonstrated that inorganic resists are capable of exhibiting a higher contrast than standard organic resists, they often exhibit intrinsically lower sensitivity and require complex deposition methods.

Projection optical lithography at 157 nm employing an excimer F2 laser constitutes a valuable lithographic method, however materials containing unsaturated groups such as carbonyl (C=O bonds) and alkene (C=C bonds) have strong absorptions at this wavelength. As a result, resists that are utilitarian with 157 nm projection optical lithography must avoid these groups to achieve the necessary transparency at this wavelength. One method to achieve this goal is to use polymeric resists in which polymerization has occurred through these unsaturated groups, for example, polyacetals. However, it is also necessary the any substituents or side chains also be transparent at this wavelength, therefore a polymer containing Si—O bonds and C—F or C—Cl bonds is particularly utilitarian.

One embodiment of the present invention, which utilizes a polyacetal polymeric resist incorporating Si—O—Si groups from a POSS moiety into the polyacetal which, along with the C—F linkages form the polymerized hexafluoroacetone, fulfills these objectives. General details of the preparation of a POSS-containing polyacetal are described in Example 20. In one embodiment, hexafluoroacetone [(CF$_3$)$_2$C=O] can be condensed with POSS disilanols such as disilanol cyclopentyl POSS (Si$_8$O$_{11}$(c-C$_5$H$_9$)$_8$(OH)$_2$), disilanol isobutyl POSS (Si$_8$O$_{11}$(i-C$_4$H$_9$)$_8$(OH)$_2$), or dimethylphenyldisilanol cyclopentyl POSS (Si$_8$O$_9$(c-C$_5$H$_9$)$_7$(OSiMe$_2$Ph)(OH)$_2$), in the presence of an acid catalyst such as toluene sulfonic acid. A slight excess of the POSS disilanol is used to ensure the presence of hydroxyl end groups in the oligomers and polymer. The resulting acetal oligomers and polyacetals have excellent film-forming and adhesion properties on a silicon wafer due to the presence of the POSS silicon oxide units. A variety of halogenated ketones and aldehydes may be used as precursors for the polyacetal, including, but not limited to, hexafluoroacetone, trifluoroacetone, hexachloroacetone, trichloroacetone, trifluoroacetaldehyde, trichloroacetaldehyde, thiocarbonylfluoride, hexafluorothioacetone, mixtures thereof, and derivatives thereof. In addition to fluorine- and chlorine-substituted aldehydes and ketones, bromo- and iodo-substituted aldehydes and ketones are also useful.

Resists prepared in this fashion are blended with photo-acid generating groups (PAGs) including ionic PAGs such as sulfonium and ionium salts, as well as nonionic PAGs. Thus, upon exposure to radiation, especially 157 nm projection optical lithography employing an excimer F2 laser, the polyacetals prepared in this fashion are susceptible to acid-catalyzed cleavage. The incorporation of the silicon oxide moieties in these resists provides the necessary etch resistance. All types of wavelengths and sources used for lithography are useful for such a resist, but these POSS-containing polyacetals are especially useful for 157 nm lithography.

The present invention is further illustrated by the following examples, which are not to be construed in any way as imposing limitations upon the scope thereof. On the contrary, it is to be clearly understood that resort may be had to various other embodiments, modifications, and equivalents thereof which, after reading the description herein, may suggest themselves to one of ordinary skill in the art without departing from the spirit of the present invention or the scope of the appended claims.

EXAMPLE 1

Preparation of a Silica Nanoparticle-Modified ZEP520® Nanocomposite at Different Loadings.

Surface functionalized silica nanoparticles of the POSS molecule Si$_8$O$_{12}$(OSiMe$_2$CH$_2$CH$_2$C$_6$H$_9$)$_8$ (Tal Materials, Inc., Ann Arbor, Mich.) were blended in a ZEP520® (poly (α-chloroacrylate-co-α-methyl styrene, Zeon Chemicals L.P., Louisville, K.y.) polymer matrix, at various weight percent loadings. Thus composite samples containing 4%, 7%, and 15% by weight of the silica nanoparticle in the composite were prepared. This mixture was then subjected to gentle sonication for 12 hours to ensure thorough blending of the nanoparticle in the matrix. The resulting nanocomposite was then handled in a similar manner as pure ZEP520® in preparing and utilizing a resist.

Various POSS species can be utilized in the preparation of this composite, depending upon the particular surface group required for polymer compatibility. Thus, surface functionalization of POSS nanoparticles $Si_8O_{12}R_8$ using hydrophobic surface groups such as isooctyl, cyclohexyl, cyclopentyl, isobutyl, methyl or phenyl (Hybrid Plastics, Fountain Valley, Calif.), are useful for blending with the hydrophobic ZEP520® copolymer (poly(α-chloroacrylate-co-α-methyl styrene). Similarly, silica nanoparticles that are surface functionalized with hydrophilic groups, such as $Si_8O_{12}(OSiMe_2CH_2CH_2CH_2OH)_8$, $Si_8O_{12}(O^-NMe_4+)_8 \cdot 60H_2O$, or $Si_8O_{12}(CH_2CH_2CH_2NH_3+Cl^-)$ may be utilized with appropriate hydrophilic polymer matrices.

EXAMPLE 2

Plasma Etching Rate of a Silica Nanoparticle-Modified ZEP520® at Different Loadings.

A sample of silica nanoparticle-modified ZEP520® using $Si_8O_{12}(OSiMe_2CH_2CH_2C_6H_9)_8$ was prepared according to Example 1 of the present invention and the plasma etching rate determined at different nanoparticle loadings. The silica particles have diameters in the 1–2 nm range and their surface was chemically modified to increase their solubility in organic solvents and compatibility with commercial ZEP520®. Various POSS species can be utilized in this composite, depending upon the particular surface group required for polymer compatibility, as described in Example 1. In this example, the hydrophobic surface functional groups were compatible with the ZEP520® matrix. Plasma etching was carried out at a RF power of 0.25 W/cm², a DC bias of 300 V and a pressure of 60 mTorr with a $CF_4$ flow rate of 12.6 sccm or an $O_2$ flow rate of 30 sccm. Compared with pure ZEP520®, incorporation of silica nanoparticles did not increase the etching resistance with $CF_4$. Replacing $CF_4$ with $O_2$ marginally increased the etching resistance at low loading of silica nanoparticles in ZEP520® (4 wt %), but at a higher loading the resistance enhancement was significant. The etching rate decreased from 2000 Å/min for ZEP520® to about 100 Å/min for 7 wt % silica nanoparticle loaded ZEP520®.

oven, maintained at greater than 100° C. for 30 h, before testing. DSC measurements were carried out at a temperature ramp rate of 20° C./min under an $N_2$ flow of 40 ml/min. The results of these experiments are shown in Table 2. The results are interpreted based upon the assumption that if inorganic particles are miscible in the polymer, and have strong interactions with polymer materials, then the composite will exhibit a higher glass transition temperature ($T_g$) that the pure polymer, as particles can be treated as a crosslinking agent. Otherwise the composite will show a lower $T_g$ as the particles behave as a plasticizer (See: E. Bourgeat-Lami, P. Espiard, A. Guyot, S. Briat, C. Gauthier, G. Vigier and J. Perez, *Hybrid Organic-Inorganic Composites, ACS Symposium Series* 585, Ed., J. E. Mark, C. Y-C Lee and P. A. Bianconi, Chapter 10, American Chemical Society, Washington, D.C. 1995.) These DSC experiments indicated that the addition of silica nanoparticles to ZEP520® increased the glass transition temperature of the composite to around 160–170° C. However for loadings higher than 4.0 wt %, the increase of $T_g$ leveled off, implying that 4.0 wt % loading of silica nanoparticles in ZEP520® corresponded to the saturation concentration. When the loading was higher, silica nanoparticles tended to aggregate and under optical microscopy a phase separation was observed.

EXAMPLE 4

Assessment of the Electron-Beam Lithographic Performance of a Silica Nanoparticle-Modified ZEP520® Resist and Comparison with a Pure ZEP520® Resist One concern about silica nanoparticles is that they might decrease the sensitivity and contrast of the host resist ZEP520. ® To investigate the effect of silica nanoparticles on the host resist, normalized residual thickness (NRT) curves were measured for both a silica incorporated ZEP520® nanocomposite and pure ZEP520® under identical conditions. Electron-beam lithography was performed with a scanning electron microscope equipped with a pattern generator. During all the experiments, the e-beam energy was fixed at 20 keV. Since at relatively high loadings of silica nanoparticles a phase separation occurred, only a sample with 4.0% by wt $Si_8O_{12}(OSiMe_2CH_2C_6H_9)_8$ nanoparticles in ZEP520® was examined in this study. The

TABLE 1

Plasma etching rates of silica nanoparticle-modified ZEP520 ® where $Si_8O_{12}(OSiMe_2CH_2CH_2C_6H_9)_8$ nanoparticles (ca. 1–2 nm diameter) are incorporated into ZEP520 ® at various weight percents. Etching rates reported in Å/min.

|        | ZEP520 ® | 4% nanoparticle in ZEP520 ® | 7% nanoparticle in ZEP520 ® | 15% nanoparticle in ZEP520 ® |
|--------|----------|------------------------------|------------------------------|-------------------------------|
| $CF_4$ | 558      | 571                          | 550                          | 613                           |
| $O_2$  | 1976     | 1935                         | 100                          | 80                            |

EXAMPLE 3

Differential Scanning Calorimetry (DSC) Study of a Silica Nanoparticle-Modified ZEP520® at Different Loadings.

Differential scanning calorimetry (DSC) was used to estimate the compatibility between silica nanoparticles and ZEP520®. Nanocomposite samples were prepared at 4%, 7%, and 15% $Si_8O_{12}(OSiMe_2CH_2CH_2C_6H_9)_8$ nanoparticles in ZEP520®, and all samples were dried under vacuum in an normalized residual thickness (NRT) versus electron exposure curve, obtained by comparing the thickness of the exposed area with that of the nearest unexposed area, revealed that the incorporation of silica nanoparticles had no significant effect on ZEP520® in terms of sensitivity and contrast. Thus, the silica nanoparticle/ZEP520® nanocomposites exhibited high sensitivity (less than 8 $\mu C/cm^2$) and high contrast values (~2.5), close to the values of reported in the literature for pure ZEP520®. See: K. E. Gonsalves, Y. Hu, H. Wu, R. Panepucci and L. Merhari; Forefront of Lithographic Materials Research-Proceedings of the 12th Int. Conf. On Photopolymers, McAfee N.J. 2000, SPE Mid Hudson Section, 2001, p 51. ; H. Ito, M. M. Khojatseh and W. Li, Hopewell Junction, N.Y. This result is very plausible since ZEP520® was the main component of the nanocomposite.

As a preliminary assessment of the lithographic performance of the nanocomposite resist, the line widths and resolution of the patterns (isolated lines) drawn with the e-beam (20 keV, 25 $\mu C/cm^2$) in the silica nanoparticles/ZEP520® film were compared with those in ZEP520® films patterned under the same conditions. This assessment involved writing lines with an electron beam with the objective of obtaining 60 nm and 40 nm widths in an ca. 400 nm thick, unmodified ZEP520® film. This experiment resulted in linewidths of 230 nm and 131 nm, respectively. However when the same lines were drawn in the ca. 400 nm thick nanocomposite film (4.0 wt % nanoparticle loading), the obtained linewidths were 69 nm and 47 nm, respectively. In this case, the resolution was close to the e-beam diameter, with less than 20% line broadening observed.

The compatibility between nanoparticles and ZEP520® in the nanocomposite is an important factor in minimizing line broadening during electron-beam lithography, as indicated by the line edge roughness which was observed when phase separation occurred. Phase separation occurred, as indicated by line edge roughness, in nanocomposite samples of ZEP520® containing 7 wt % $Si_8O_{12}$ $(OSiMe_2CH_2CH_2C_6H_9)_8$ nanoparticles, by optical microscopy, whereas no phase separation occurred in those nanocomposites with 4 wt % of nanoparticles.

EXAMPLE 5

Line-Broadening Sensitivity to Variations in Electron Incident Fluences of a Silica Nanoparticle-Modified ZEP520® Resist It is useful to assess how sensitive the line broadening in a given patterned resist system is to the variations of electron incident fluences, especially for practical applications. To this end, with the objective of writing 60 nm wide lines in the silica nanoparticles/ZEP520® nanocomposite comprising 4.0 wt % $Si_8O_{12}(OSiMe_2CH_2CH_2C_6H_9)_8$ nanoparticles, with a 20 keV electron beam at increasing fluences, the beam current was kept constant while the exposure time was increased. A linear increase of the line width with the electron beam fluence was observed. Even for the highest fluence imposed (ca. 110 $\mu C/cm^2$) the obtained line width was still narrower than that in ZEP520® (206 nm vs 230 nm). From these studies, it is seen that sub-100 nm wide lines can be written in a 400 nm thick film of ca. 4.0 wt % silica nanoparticles/ZEP520® nanocomposite provided the fluence is less than ca. 50 $\mu C/cm^2$ at 20 keV.

EXAMPLE 6

Comparison of the Closely-Spaced Pattern Stability in Silica Nanoparticle/ZEP520® Nanocomposite Resists and a Pure ZEP520® Resist as an Indication of Pattern Transfer Fidelity The shallow trenches generated in 350 nm films using a 20 keV electron beam, for both nanocomposite POSS silica nanoparticle/ZEP520® and pure ZEP520® films, indicated the electron beam did not have sufficient energy to penetrate to this depth in either sample. Therefore, higher voltage 50 and 100 keV electron beams were examined on both commercial (pure) and incorporated (POSS nanocomposite) ZEP520®. Film thickness was 280 nm for 4 wt % silica nanoparticle-incorporated ZEP520® and 300 nm for pure ZEP520®. Clear cross sectional images were obtained at 150 $\mu C/cm^2$ at 50 keV and 210 $\mu C/cm^2$ at 100 keV, with a 60 nm nominal (fixed) line width.

The pattern designed for the exposure at 50 keV and 100 keV had a fixed line width of 60 nm with various line spaces of 6 times the line width (6 w), 5 w, 4 w, 3 w, 2 w, 1 w and ½ w. At 150 $\mu C/cm^2$ with an e-beam energy of 50 keV, the pattern on nanocomposite silica nanoparticle/ZEP520® (i.e. POSS/ZEP520®) gave trenches with an actual width of about 64 nm. The pattern totally collapsed when the line space reached 1 w, i.e. 60 nm. However with a line space of 2 w, i.e., 120 nm, the writing pattern showed a good mechanical stability. At 210 $\mu C/cm^2$ with an e-beam energy of 100 keV, the pattern on nanocomposite POSS/ZEP520® gave trenches with a actual width of about 67 nm even when the spacing was as low as 1 w, i.e., 60 nm.

The same patterns written on pure ZEP520® under the same dose at 50 keV gave a broader trench with a width of 121 nm, more than 100% broadening effect due to the proximity effects of the electron beam. Although the trench was still distinguishable when the line space reached 2 w, i.e. 120 nm, the pattern began to collapse at this spacing as indicated by a much wider trench. At 100 keV, the deterioration of the written pattern was even more obvious compared with the results obtained with nanocomposite of silica nanoparticle/ZEP520®. The pattern written at 100 keV on pure ZEP520® gave 110 nm trenches and began to collapse when the line spacing was 2 w. This pattern completely collapsed when the spacing reached 1 w.

EXAMPLE 7

Preparation of a Methacrylate-Based CA Resist Incorporating a Polyhedral Oligosilsesquioxane (POSS).

All monomeric components used in the polymer preparation were purchased from Polysciences (Warrington, Pa.) or Aldrich (Milwaukee, Wis.). The liquid monomers, tert-butyl methacrylate (TBMA), methyl methacrylate (MMA), and methacrylic acid (MAA) were vacuum distilled under nitrogen prior to use. The inhibitor-free polyhedral oligosilsesquioxane, 3-(3,5,7,9,11,13,15-heptacyclopentylpentacyclo-[9.5.1.1$^{3,9}$.1$^{5,15}$1$^{7,13}$]octasiloxane-1-yl)propyl methacrylate, abbreviated propyl methacrylate POSS, (Aldrich) was used as received. Tetrahydrofuran (THF) was distilled from sodium and benzophenone under nitrogen. Hexane was reagent grade and used as received. α,α'-Azobis(isobutyronitrile) (AIBN) was recrystallization twice from methanol prior to use. Polypropylene glycol methyl ether (PGME) was obtained from Aldrich and used as received. The developer AZ® MIF 300, obtained from AZ Electronics (Somerville, N.J.), was a 0.26 N aqueous solution of tetramethylammonium hydroxide (TMAH). Solutions of 0.02 N TMAH used as developers in this work were prepared by dilution of the 0.26 N TMAH solutions with deionized water. Triphenyl sulfonium hexafluoroantimonate, used as a photoacid generator (PAG) for resist formulation, was purchased from Polysciences as a 50 wt % solution in PGME.

All polymer samples were synthesized by AIBN-initiated free radical polymerization. A typical polymerization procedure is as follows. The monomers (typically 5 grams) and 1 wt % AIBN with respect to the total monomer weight, were dissolved in THF. The solution was filtered through a 0.5 $\mu m$ Teflon microfilter into a sealed flask. Three successive freeze-pump-thaw cycles were run to remove oxygen from the sample. The clear solution was then placed in a 60° C. oil bath under stirring. The reaction was maintained under a nitrogen atmosphere for 1 day to achieve high conversion. After this time, the reaction mixture was added dropwise, with stirring, into sufficient hexane to precipitate the polymer. The polymer was filtered off and washed thoroughly with hexane. Samples of polymer isolated in this fashion were purified by reprecipitation from THF/hexane. Finally the samples were dried under vacuum at 60° C. for 1–2 days.

EXAMPLE 8

Characterization of a Methacrylate-Based CA Resist Incorporating a Polyhedral Oligosilsesquioxane (POSS).

The thermal stability of all samples was measured by a Perkin Elmer Thermogravimetric Analyzer 7 (TGA). TGA samples were heated at a rate of 20° C./min with an $O_2$ or $N_2$ gas flow rate of 25 $cm^3$/min. Glass transition temperatures (Tg) were measured by a Perkin Elmer Differential Scanning Calorimeter 7 (DSC). DSC samples were heated at a rate of 20° C./min. Molecular weights were measured by a Millipore Waters GPC using THF as an eluent and polystyrene calibration standards.

Polymer compositions were obtained by a combination of $^1$H NMR and TGA analyses. The $^1$H NMR spectra were obtained on a Bruker Win-500 NMR spectrometer using acetone-$d_6$ as a solvent. The relative composition of the monomers POSS, MMA, TBMA and MAA in a resulting polymer sample were calculated from the area ratios of their characteristic peaks. These data are presented below in Table 2. In parallel, the POSS content was also determined independently by TGA using the following procedure. Approximately 10 mg of polymer sample was placed on a TGA pan and heated at a heating rate of 20° C./min from room temperature to 800° C. in pure oxygen with a gas flow rate of 25 ml/min, and maintained at 800° C. for 0.5 h. The weight loss of the sample over this process was used to calculate the sample's POSS content, based upon the assumption that any residue remaining after burning the polymer sample in oxygen constituted pure silicon dioxide. This assumption was validated by burning the POSS monomer using the same procedure and performing the same calculations. By this procedure, the POSS monomer data, which was measured to have a 46.86% weight loss after burning, was well in agreement with the calculated value of 46.81%.

An illustration of the microstructure of a POSS/MMA/TBMA/-MAA copolymer is presented in FIG. 1. Table 2 presents the relative weight percents of monomers loaded into the mixture to be polymerized, and the percent composition of that monomer in the resulting polymer. Table 2 also presents the glass transition temperatures (Tg), weight-average molecular weights ($M_w$), and polydispersity indices (PDI) of each polymer sample.

TABLE 2

Polymer composition and physical properties of the POSS-containing methacrylate co-polymers.

| Sample No. | Polymer Composition: Loading (In Polymer) wt % | | | | $T_g$ (° C.) | $M_w$ g/mol × $10^5$ | PDI |
|---|---|---|---|---|---|---|---|
| | POSS | MMA | MAA | TBMA | | | |
| 8a | 10(12.5) | 30(24.7) | 20(28.9) | 40(33.8) | 170 | 1.82 | 1.51 |
| 8b | 20(22.5) | 20(17.3) | 20(22.8) | 40(37.5) | 179 | 1.80 | 1.43 |
| 8c | 30(30.5) | 10(7.0)  | 20(24.6) | 40(33.8) | 186 | 1.76 | 1.48 |
| 8d | 0(0)     | 40(39.9) | 20(12.6) | 40(47.5) | 168 | 1.83 | 1.47 |

EXAMPLE 9

Etch Study and Polymer Morphology Characterization of a Methacrylate-Based CA Resist Incorporating a Polyhedral Oligosilsesquioxane (POSS).

Resist solutions (typically 5–10 wt %) were formulated by dissolving polymer samples, along with 2% by weight (relative to the polymer) of the photoacid generator (PAG) triphenyl sulfonium hexafluoroantimonate, in PGME. The low-POSS samples (<22.5% POSS) were readily soluble in PGME without heating, while the high-POSS sample (30.5%) must be heated to 40° C. to achieve fast dissolution. The resist solutions were filtered through a 0.2 μm Teflon micro filter to remove any undissolved residue.

Thin films were spin cast on 3-inch silicon wafers on a Brewer/CEE Model 6000 Wafer Processing Track System using a spinning speed of 1500 rpm and spinning times of 60 sec. The films were then baked on a hot plate at 125° C. for 3 min. After cooling to room temperature, the resist-coated wafer was placed in the plasma chamber of the etcher (Plasma Therm System 72 Reactive Ion Etcher), with half of the resist-coated wafer covered with a specially-fit glass slide. Typical etching conditions were 60 mtorr pressure, a power density of 0.25 $W/cm^2$, and either $CF_4$ or $O_2$. plasma gases, with gas flow rates of 12.6 and 30 sccm for $CF_4$ and $O_2$, respectively. Etch rates were calculated by dividing the thickness difference between the slide-covered and uncovered areas on the resist film by etch times, and are recorded in Table 3. Film thickness was measured on a Tencor AlphaStep 200 Surface Profilometer. Etching times were carefully selected to ensure that the uncovered area of the resist film was not entirely eroded away during the etch process.

High-resolution transmission electron microscopy (HRTEM) samples were prepared from acetone solutions of the polymers and deposited on copper grids with a carbon film. HRTEM studies were performed on a JEOL-4000EX microscope with a point-to-point resolution of approximately 1.7 Å. The TEM images were obtained under optimum defocus conditions in which the atom columns appear as block dots. Images were digitized using a high-resolution camera and then computer-processed to reduce the noise arising from the matrix. HRTEM revealed that the RIE improvement was due to the formation of rectangular crystallite-constituting networks of the silica cages, uniformly distributed within the polymer matrix.

TABLE 3

Etch Rate Date for Methacrylate-Based CA Resist Incorporating a Polyhedral Oligosilsesquioxane (POSS).

| Sample No. | POSS in polymer wt % | RIE Rate Å/min in $O_2$ | in $CF_4$ |
|---|---|---|---|
| 8a | 12.5 | 2500 | 835 |
| 8b | 22.5 | 1700 | 850 |
| 8c | 30.5 | 900 | 1167 |
| 8d | 0 | 2500 | 840 |

EXAMPLE 10

Imaging Experiments and Characterization of a Methacrylate-Based CA Resist Incorporating Polyhedral Oligosilsesquioxanes (POSS).

For imaging experiments, resist formulation and film preparation were the same as those described in Example 9 for etch study. Resist film that was spin-cast on 3-inch Si wafers from PGME solutions and were pre-baked at 125° C. for 2 min. All samples had good solubility in PGME, even though they contained inorganic side groups. The exposure experiments were performed on a Leo 982 SEM with a pattern generator using 20 KeV electron beam. Similar exposure experiments were performed using under UV irradiation at a wavelength of 248 nm. Subsequently, the exposed films were post-baked on a hotplate at 125° C. for 1 min. Development was effected by dipping the films into a 0.02 N TMAH solution for 1 min, followed by rinsing with deionized (DI) water. The resulting images were evaluated by SEM after a 20 nm gold thin film was sputtered over the resist films. The POSS-containing samples did not decrease the sensitivity of resists because of its inorganic component. Doses from 2 to 30 $\mu C/cm^2$ created equally good images. For example, micrographs showing isolated lines with a dimension of 228 nm imaged under 248 nm DUV were obtained for sample 9c at 20 keV.

EXAMPLE 11

Preparation of Additional Methacrylate-Based CA Resists Incorporating Other Polyhedral Oligosilsesquioxane (POSS) Monomers.

Other POSS components could be incorporated into the methacrylate-based CA resist according to the method of Example 7. For example, additional POSS components that could be used include, but are not limited to 3-[(3,5,7,9,11,13,15-heptacyclopentylpentacyclo-[9.5.1.1$^{3,9}$.1$^{5,15}$.1$^{7,13}$]octasiloxan-1-yloxy)dimethylsilyl]propyl methacrylate (abbreviated dimethylsilyloxy(propyl)methacrylate-POSS) and 1,3,5,7,9,11,13-heptacyclopentyl-15vinylpentacyclo-[9.5.1.1$^{3,9}$.1$^{5,15}$.1$^{7,13}$]octasiloxane (abbreviated vinyl-POSS). In addition, structurally similar POSS compounds, in which the silicon atoms at the corners of the POSS cage are substituted with R groups other than cyclopentyl, could be used in the prepraration of methacrylate-based CA resists according to the present invention. Thus, in FIG. 1, POSS monomers could be used wherein R is selected from alkyl, cycloalkyl, aryl, alkenyl, alkynyl, aralkyl, aralkenyl, heteroalkyl, heterocycloalkyl, substituted derivatives thereof, combinations thereof, or similar substitutents.

EXAMPLE 12

Preparation of a Sulfonium Photoacid Generating (PAG) Monomer

All materials used for preparation of the photoacid generating (PAG) monomeric component were obtained from Aldrich and were used as received. HCl gas was generated in situ by the reaction of concentrated sulfuric acid (98%) and analytical-grade hydrochloric acid (36.5%). The HCl gas produced was dried by passing through concentrated $H_2SO_4$. A 23.5-g (0.25 mol) sample of phenol ($C_6H_5OH$) and a 19.5-g (0.25 mol) sample of dimethyl sulfoxide ($Me_2SO$) were dissolved in 200 ml of methanol in a three-necked flask, fitted with a thermometer. This solution was cooled to below 5° C. Under stirring, anhydrous HCl was slowly bubbled through the solution until white solid appeared, indicating that the solution was saturated with the p-dimethylsulfonium chloride product, [p-HOC$_6$H$_4$SMe$_2$]Cl. Throughout the reaction, the temperature was maintained below 5° C. to avoid undesirable side reactions.

When the reaction was complete, the dissolved HCl was removed from the solution under reduced pressure in a rotary evaporator. The resulting solution was then poured into 400 ml of diethyl ether. The sulfonium chloride product [p-HOC$_6$H$_4$SMe$_2$]Cl obtained was collected by filtration, washed thoroughly with diethyl ether, and dried overnight under vacuum. The overall yield of [p-HOC$_6$H$_4$SMe$_2$]Cl was 70%, the identity of which was confirmed by $^1$H NMR spectroscopy.

A 20 g sample of the sulfonium chloride [p-HOC$_6$H$_4$SMe$_2$]Cl and a slight excess of sodium triflate (NaOSO$_2$CF$_3$) were suspended in 100 ml of anhydrous acetone and stirred vigorously at room temperature for 12 hours. The unreacted solids were filtered off, and the solvent was removed from the filtrate under vacuum to provide the sulfonium triflate compound [p-HOC$_6$H$_4$SMe$_2$]OSO$_2$CF$_3$ in 91% yield.

A 20 g (0.066 mol) sample of [p-HOC$_6$H$_4$SMe$_2$]OSO$_2$CF$_3$ and 2.68 g (00.067 mol) of sodium hydroxide were dissolved in 50 ml of methanol and the resulting solution stirred at room temperature for 1 hour. The solvent was removed under reduced pressure to provide a solid, which was extracted with 50 ml of acetone. The undissolved residue (NaOH) was filtered off and the solvent removed from the filtrate under vacuum to provide [p-NaOC$_6$H$_4$SMe$_2$]OSO$_2$CF$_3$ in 96% yield.

The sample of [p-NaOC$_6$H$_4$SMe$_2$]OSO$_2$CF$_3$ prepared in this fashion was dissolved in acetonitrile, and a 20% molar excess of methacryloyl chloride was slowly added to the solution under stirring at room temperature overnight. After this time, the precipitated NaCl was filtered off, and the filtrate was poured into 400 ml of diethyl ether to precipitate the PAG monomer product [p-CH$_2$=C(CH$_3$)C(O)OC$_6$H$_4$SMe$_2$]OSO$_2$CF$_3$, which was collected and washed thoroughly with diethyl ether. Recrystallization of this product in warm (ca. 50° C.) THF yielded pure PAG monomer [p-CH$_2$=C(CH$_3$)C(O)OC6H4SMe2]OSO$_2$CF$_3$ in 88% yield.

EXAMPLE 13

Co-Polymerization of a Sulfonium Photoacid Generating (PAG) Monomer with Methacrylate Monomers Both homo- (infra) and co-polymerization of the PAG monomer [p-CH$_2$=C(CH$_3$)C(O)OC$_6$H$_4$SMe$_2$]OSO$_2$CF$_3$ were initiated by AIBN (α,α'-azobis(isobutyronitrile)). All monomers except the PAG monomer, viz. methyl methacrylate (MMA), tert-butyl methacrylate (TBMA), itaconic anhydride (IA), and methacrylic acid (MAA) were obtained from Polysciences or Aldrich. The liquid monomers were vacuum distilled under nitrogen prior to use, and the propyl methacrylate POSS monomer (3-(3,5,7,9,11,13,15-heptacyclopentylpentacyclo-[9.5.1.1$^{3,9}$.1$^{5,15}$,1$^{7,13}$]octasiloxane-1-yl)propyl methacrylate) (Aldrich) was used as received. A typical procedure is as follows. A solution of the monomers (typically 5 g total) and 1 wt % AIBN relative to the monomers was prepared in THF and was filtered through a 0.5 μm Teflon micro filter into a sealed flask. Three freeze-pump-thaw cycles were carried out to remove oxygen from the sample. The resulting clear solution was then placed in a 60° C. oil bath under nitrogen with stirring. The reaction was stirred at this temperature for 1–2 days to achieve high conversion to the polymer. After this time, the reaction mixture was added dropwise into sufficient hexane to precipitate the polymer, which was isolated by filtration and and washed thoroughly with hexane. The PAG/methacrylate copolymers were purified by dissolving in acetone and re-precipitated with either methanol or water. Finally the purified sample was dried in vacuum at 60° C. for 1 to 2 days.

EXAMPLE 14

Characterization of a Sulfonium Photoacid Generating (PAG) Copolymer

The thermal stability of all samples was measured using a Perkin Elmer Thermogravimetric Analyzer 7 (TGA). TGA samples were heated at a rate of 20° C./min with a O$_2$ or N$_2$ gas flow of 25 cm$^3$/min. Molecular weights were measured by a Millipore Waters GPC using THF as the eluent for the copolymers and monodispersed polystyrene samples as calibration standards. Compositions in copolymers were determined by inverse-gated $^{13}$C NMR spectroscopy, combined with TGA-in-O$_2$ for determination of POSS content and elemental analysis for PAG content (by measuring sulfur content).

Table 4 presents the relative weight percents of monomers loaded into the mixture to be polymerized, and the percent composition of that monomer in the resulting polymer. Table 4 also presents the weight-average molecular weights (M$_w$) and polydispersity indices (PDI) of each polymer sample.

EXAMPLE 15

Use of a Sulfonium Photoacid Generating (PAG) Co-polymers as a Negative Resist and Acid Generating Efficiency Measurements Resist films were spin cast onto 3-inch Si wafers whose weights were predetermined on a analytical balance, from 10% wt resist solutions in acetone. The resist films were then baked at 130° C. for 5 min to remove the solvent, weighed again, and the amount of resist film on the Si wafer was determined by calculating the weight difference. The resist films were then exposed to 254 nm DUV radiation (254 nm UV lamp, model R52G, UVP, Inc., Upland, Calif.) equipped with a radiometer. Doses were calculated by exposure times multiplied by lamp intensity. Each film to be analyzed was stripped from the Si wafer with acetonitrile and added to 2 ml of a stock solution of 0.1 mM tetrabromophenol blue (TBPB) in acetonitrile. The total volume was then raised to 10 ml by the addition of acetonitrile. The resulting solution was characterized by UV spectroscopy. The amount of acid generated in each film by UV radiation was determined by monitoring the absorbance change of the TBPB indicator at 620 nm, against calibration curves predetermined by using known amounts of triflic acid. Calibration curves showed a linear relationship between the amount acid added to the indicator solution and the resulting absorbance intensity change at 620 nm. For comparison, the acid generating efficiency for each resist is expressed as mole of acid/mole of PAG units in the resist. The number of moles of PAG units in each resist was determined by elemental analysis and resist weight.

Figure 3:
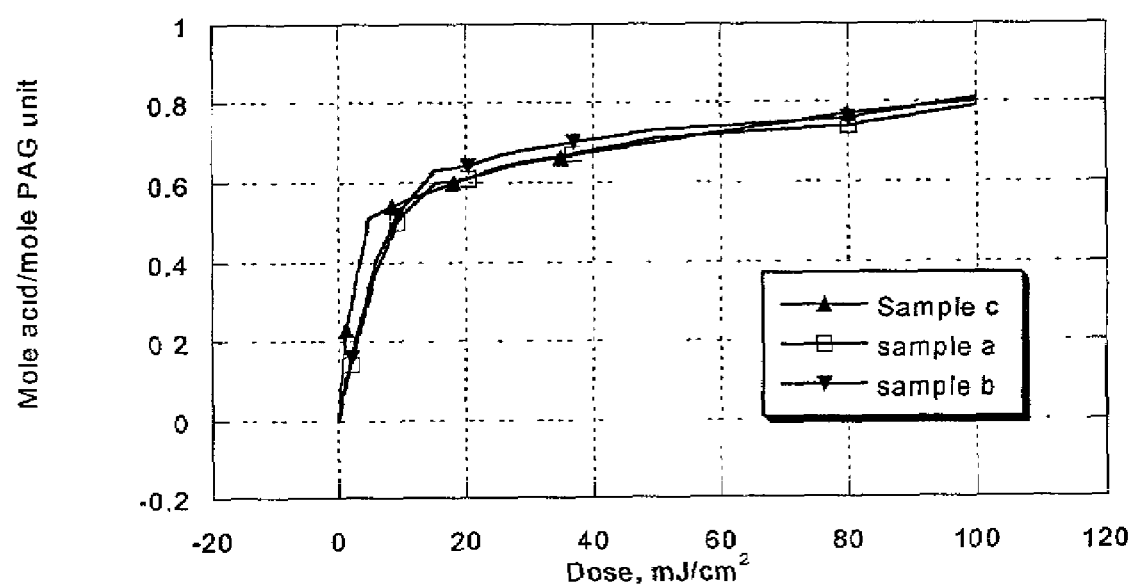
FIG. 3 is a representation of the acid-generation efficiency of samples prepared according to Table 3.

FIG. 3 presents the acid generation efficiency for the three samples described in Example 14 above. As indicated in this figure, the acid generation efficiency was substantially identical for all three samples, regardless of the differences in components and compositions among the samples.

EXAMPLE 16

Imaging Experiments for Chemically Amplified (CA) Resists Containing a Photoacid Generating (PAG) Group in the Resist Polymer Chain for PAG Co-Polymers For chemically amplified (CA) resists containing photoacid generating groups (PAG) in the chain, thin films were spin-coated onto 5-inch silicon wafers from 5 wt % polymer solutions in propylene glycol methyl ether (PGME). All resist films were prebaked at 125° C. for 2 min before exposure. The exposure experiments were performed on a Nikon EX7 DUV 248 nm Excimer Laser Stepper, after which the exposed films were post baked on a hotplate at 125° C. for 1 min. For these CA resists, development was achieved by dipping the films in 0.26 N tetramethylammo-

TABLE 4

Polymer composition and physical properties of the PAG/Methacrylate Co-polymers.

| Sample No. | Compositions Loading (in polymer), wt % | | | | | | M$_w$ (g/mol) × 10$^5$ | PDI |
|---|---|---|---|---|---|---|---|---|
| | POSS | MMA | TBMA | IA | MAA | PAG | | |
| 14a | 15(19.7) | 0(0) | 70(67.1) | 0(0) | 0(0) | 15(13.2) | 1.83 | 1.58 |
| 14b | 15(17.3) | 15(25.7) | 40(31.9) | 15(13.8) | 0(0) | 15(11.3) | 1.70 | 1.69 |
| 14c | 10(8.8) | 30(27.7) | 40(44.9) | 0(0) | 10(12.4) | 15(10.4) | 1.71 | 1.63 | nium hydroxide (TMAH) for 1 min, followed by rinsing with deionized water. The resulting images were evaluated by SEM after a 20 nm gold thin film was sputtered over the resist films.

The resists were also found to be very sensitive to electron beam radiation. The imaging experiments were carried out on a Leo 982 SEM with a Nabity pattern generator at 20 keV. The processing conditions were almost identical to the photo-exposure at 248 nm. All samples exhibited very high sensitivity under both 248 nm deep-UV and 20 keV electron exposures.

EXAMPLE 17

Preparation of a Sulfonium Photoacid Generating (PAG) Homopolymer

The homo-polymerization reaction of the PAG monomer [p-CH$_2$=C(CH$_3$)C(O)OC$_6$H$_4$SMe$_2$]OSO$_2$CF$_3$ was initiated by AIBN (α,α'-azobis(isobutyronitrile)). A typical procedure is as follows. A solution of about 5 g of PAG monomer and 1 wt % AIBN relative to the monomer was prepared in acetonitrile and filtered through a 0.5 μm Teflon micro filter into a sealed flask. Three freeze-pump-thaw cycles were carried out to remove oxygen from the sample. The resulting clear solution was then placed in a 60° C. oil bath in a nitrogen atmosphere, under stirring. The reaction was stirred at this temperature for 1–2 days to achieve high conversion to the polymer. After this time, the reaction mixture was added dropwise into sufficient hexane to precipitate the polymer, which was isolated by filtration and and washed thoroughly with hexane. This PAG homopolymer was purified by dissolving in methanol and re-precipitation from THF. Finally the purified sample was dried in vacuum at 60° C. for 1 to 2 days.

EXAMPLE 18

Characterization of a Sulfonium Photoacid Generating (PAG) Homopolymer

The thermal stability, molecular weight, composition, elemental analysis, etc. characterizations of the PAG homopolymer were detemined in the same manner as described in Example X for the PAG co-polymers, except that N-methyl pyrrolidinone (NMP) was used as the eluent for the PAG homopolymer in the GPC experiments.

EXAMPLE 19

Imaging Experiments For PAG Homopolymers

For chemically amplified (CA) resists containing photoacid generating groups (PAG) in the chain, thin films were spin-coated onto 5-inch silicon wafers from 5 wt % polymer solutions in water. The dissolution rate of the polymer in water was very slow at room temperature. An elevated temperature of about 50° C. was used to rapidly dissolve the polymer in water. All resist films were prebaked at 125° C. for 2 min before exposure. The exposure experiments were performed on a Nikon EX7 DUV 248 nm Excimer Laser Stepper. After exposure, the PAG homopolymer required no post bake process. Development of the exposed homopolymer was achieved by dipping the films in water with a pH of 7.2–7.5, adjusted by adding tetramethylammonium hydroxide (TMAH) for about 1 min, followed by rinsing with deionized water. The resulting images were evaluated by SEM after a 20 nm gold thin film was sputtered over the resist films. Thus, SEM micrographs of a negative-tone pattern obtained for this resist by exposure to 248 nm radiation at a dose of 50 mJ/cm$^2$ revealed a feature dimension of approximately 250 nm.

It was also found that this polymer was also very sensitive to electron beam radiation. Imaging experiments were run on a Leo 982 SEM with a Nabity pattern generator at 20 keV. The processing conditions were almost identical to the photo-exposure at 248 nm. Accordingly, SEM micrographs of negative-tone lines obtained for this resist at a dose of 25μ C./cm$^2$ provided line dimensions of approximately 200 nm.

EXAMPLE 20

Preparation and Utility of Polyhedral Oligosilsesquioxanes (POSS)-Containing Polyacetal Resists POSS disilanols such as Si$_8$O$_{11}$(c-C$_5$H$_9$)$_8$(OH)$_2$ (disilanol cyclopentyl POSS), Si$_8$O$_{11}$(i-C$_4$H$_9$)$_8$(OH)$_2$ (disilanol isobutyl POSS), or Si$_8$O$_9$(c-C$_5$H$_9$)$_7$(OSiMe$_2$Ph)(OH)$_2$ (dimethylphenyldisilanol cyclopentyl POSS, all from Hybrid Plastics, Fountain Valley, Calif.) are used in this embodiment of the present invention. Hexafluoroacetone (CF$_3$)$_2$C=O can be condensed and contacted with POSS disilanols such as those listed above, in the presence of an acid catalyst such as toluene sulfonic acid. A slight excess of the POSS disilanol is used to ensure the presence of hydroxyl end groups in the resulting oligomers and polymer. The water generated during the reaction is continuously distilled off as the polymerization reaction proceeds. The resulting acetal oligomers and polyacetals have excellent film-forming and adhesion properties on a silicon wafer due to the presence of the POSS silicon oxide units.

Resists prepared in this fashion are blended with photoacid generating groups (PAGs) including ionic PAGs such as sulfonium and ionium salts, as well as nonionic PAGs. Thus, upon exposure to radiation, especially 157 nm projection optical lithography employing an excimer F2 laser, the polyacetals prepared in this fashion are susceptible to acid catalyzed cleavage. The incorporation of the silicon oxide moieties in resists of this type provides the necessary etch resistance. A variety of radiation sources may be used, including but not limited to, ultraviolet (UV) radiation, extreme ultraviolet (EUV) or deep ultraviolet (DUV) radiation, X-rays, electron beams, and ion beams, however this resist is especially useful for 157 nm lithography.

What is claimed is:

1. A nanocomposite resist comprising:
   a nanoparticle component; and
   a polymer component wherein the nanoparticle component comprises a polyhedral oligosilsesquioxane and the polymer component comprises poly(α-chloroacrylate-co-α-methyl styrene).

2. The nanocomposite resist of claim 1, wherein the polyhedral oligosilsequioxane comprises a compound of formula Si$_8$O$_{12}$(OR)$_8$, Si$_8$O$_{12}$R$_8$, Si$_{12}$O$_{18}$(OR)$_{12}$, or Si$_{12}$O$_{18}$R$_{12}$, wherein R is selected from alkyl, substituted alkyl, cycloalkyl, substituted cycloalkyl, silyl, substituted silyl, aryl, substituted aryl, aralkyl, substituted aralkyl, alkenyl, or substituted alkenyl.

3. A lithographic process comprising:
   exposing a lithographic recording medium to radiation to form a pattern; and
   developing the pattern;
   wherein the lithographic recording medium comprises a nanocomposite resist comprising a nanoparticle component and a polymer component, the nanoparticle component comprising a polyhedral oligosilsesquioxane and the polymer component comprising poly(α-chloroacrylate-co-α-methyl styrene).

4. The lithographic process of claim 3, wherein the polymer component further comprises poly(2,2,2-trifluoroethyl-α-chloroacrylate), poly(methyl methacrylate), poly (butene sulfone), polysilanes, polyacetals, or combinations thereof.

5. An integrated circuit prepared by the lithographic process of claim 3.

6. The lithographic process of claim 3, wherein the radiation comprises an electron beam.

7. The lithographic process of claim 3, wherein the radiation comprises an ion beam.

8. The lithographic process of claim 3, wherein the polymer component comprises a polymer that undergoes chain scission upon exposure to electron beam irradiation.

9. The lithographic process of claim 3, wherein the nanoparticle component comprises a nanoparticle having an average diameter less than about 100 nanometers.

10. The lithographic process of claim 3, wherein the nanoparticle has an average diameter less than about 10 nanometers.

11. The lithographic process of claim 3, wherein the nanoparticle has an average diameter less than about 2 nanometers.

12. The lithographic process of claim 3, wherein the polyhedral oligosilsesquioxane comprises a compound of formula $Si_8O_{12}(OR)_8$, $Si_8O_{12}R_8$, $Si_{12}O_{18}(OR)_{12}$, or $Si_{12}O_{18}R_{12}$, wherein R is selected from alkyl, substituted alkyl, cycloalkyl, substituted cycloalkyl, silyl, substituted silyl, aryl, substituted aryl, aralkyl, substituted aralkyl, alkenyl, or substituted alkenyl.

13. The lithographic process of claim 3, wherein the resist comprises from about 1% to about 50% by weight of the nanoparticle component.

14. The lithographic process of claim 3, wherein the resist has a glass transition temperature of at least about 160° C.

15. A polymeric chemically amplified resist comprising:
a methacrylate component;
a polyhedral oligosilsesquioxane component; and
a photoacid generating component;
wherein the methacrylate component does not comprise a polyhedral oligosilsesquioxane moiety.

16. The polymeric chemically amplified resist of claim 15, wherein the methacrylate component comprises methyl methacrylate, t-butyl methacrylate, methacrylic acid, or combinations thereof.

17. The polymeric chemically amplified resist of claim 15, wherein the polyhedral oligosilsesquioxane component comprises 3-(3,5,7,9,11,13,15-heptacyclopentylpentacyclo-[9.5.1.1$^{3,9}$.1$^{5,15}$.1$^{7,13}$]octasiloxane-1 -yl)propyl methacrylate; 3-[(3,5,7,9,11,13,15-heptacyclopentylpentacyclo-[9.5.1.1$^{3,9}$.1$^{5,15}$.1$^{7,13}$]octasiloxan-1-yloxy)dimethylsilyl] propyl methacrylate; 1,3,5,7,9,11,13-heptacyclopentyl-15vinylpentacyclo-[9.5.1.1$^{3,9}$.1$^{5,15}$.1$^{7,13}$]octasiloxane, or combinations thereof.

18. The polymeric chemically amplified resist of claim 15, wherein the polymeric resist comprises 1% to about 40% by weight of the polyhedral oligosilsesquioxane component.

19. The polymeric chemically amplified resist of claim 15, wherein the polymeric resist has a glass transition temperature greater than about 165° C.

20. The polymeric chemically amplified resist of claim 15, wherein the polymeric resist has a weight-average molecular weight greater than about 100,000 g/mol.

21. The polymeric chemically amplified resist of claim 15, wherein the polymeric resist has a polydispersity index between 1 and about 2.

22. A lithographic process comprising:
exposing a lithographic recording medium to radiation to form a pattern; and
developing the pattern;
wherein the lithographic recording medium comprises the polymeric chemically amplified resist of claim 15.

23. The lithographic process of claim 22, wherein the methacrylate component comprises methyl methacrylate, t-butyl methacrylate, methacrylic acid, or combinations thereof.

24. The lithographic process of claim 22, wherein the polyhedral oligosilsesquioxane component comprises 3 -(3, 5,7,9,11,13,15 -heptacyclopentylpentacyclo-[9.5.1.1$^{3,9}$.1$^{5,15}$.1$^{7,13}$]octasiloxane-1-yl)propyl methacrylate; 3-[(3,5,7,9,11,13,1 5-heptacyclopentylpentacyclo-[9.5.1.1$^{3,9}$.1$^{5,15}$.1$^{7,13}$]octasiloxan-1-yloxy)dimethylsilyl]propyl methacrylate; 1,3,5,7,9,11,13-heptacyclopentyl -15vinylpentacyclo-[9.5.1.1$^{3,9}$.1$^{5,15}$.1$^{7,13}$]octasiloxane, or combinations thereof.

25. An integrated circuit prepared by the lithographic process of claim 22.

26. The lithographic process of claim 22 wherein the radiation comprises an electron beam.

27. The lithographic process of claim 22, wherein the radiation comprises an ion beam.

28. The lithographic process of claim 22, wherein the radiation comprises X-ray radiation.

29. A polymeric chemically amplified resist comprising methyl methacrylate, t-butyl methacrylate, methacrylic acid, and 3-(3,5,7,9,11,13,15-heptacyclopentylpentacyclo-[9.5.1.1$^{3,9}$.1$^{5,15}$.1$^{7,13}$]octasiloxane- 1-yl)propyl methacrylate.

30. A polymeric chemically amplified resist comprising:
a methacrylate component; and
a polymerizable photoacid generating component;
wherein the methacrylate component does not comprise a photoacid generating moiety and the polymerizable photoacid generating component comprises [p-CH$_2$=C(CH$_3$)C(O)OC$_6$H$_4$SMe$_2$]OSO$_2$CF$_3$.

31. The polymeric chemically amplified resist of claim 30, wherein the methacrylate component comprises methyl methacrylate, t-butyl methacrylate, methacrylic acid, or combinations thereof.

32. The polymeric chemically amplified resist of claim 30 further comprising a dissolution promoter.

33. The polymeric chemically amplified resist of claim 32 wherein the dissolution promoter comprises itaconic anhydride.

34. The polymeric chemically amplified resist of claim 30, wherein the photoacid generating component comprises a sulfonium compound, an ionium compound, or combinations thereof.

35. The polymeric chemically amplified resist of claim 30, further comprising a polyhedral oligosilsesquioxane component.

36. The polymeric chemically amplified resist of claim 35, wherein the polyhedral oligosilsesquioxane component comprises 3-(3,5,7,9,11,13,15-heptacyclopentylpentacyclo-[9.5.1.1$^{3,9}$.1$^{5,15}$.1$^{7,13}$]octasiloxane-1-yl)propyl methacrylate; 3-[(3,5,7,9,11,13,1 5-heptacyclopentylpentacyclo-[9.5.1.1$^{3,9}$.1$^{5,15}$.1$^{7,13}$]octasiloxan-1-yloxy)dimethylsilyl] propyl methacrylate; 1,3,5,7,9,11,13-heptacyclopentyl-15vinylpentacyclo-[9.5.1.1$^{3,9}$.1$^{5,15}$.1$^{7,13}$]octasiloxane, or combinations thereof.

37. The polymeric chemically amplified resist of claim 35, wherein the polymeric resist comprises about 1% to about 35% by weight of the polyhedral oligosilsesquioxane component.

38. The polymeric chemically amplified resist of claim 30, wherein the polymeric resist has a weight-average molecular weight between 20,000 to 100,000 g/mol.

39. The polymeric chemically amplified resist of claim 30, wherein the polymeric resist has a polydispersity index between 1 and about 2.

40. A lithographic process comprising:
exposing a lithographic recording medium to radiation to form a pattern; and
developing the pattern;
wherein the lithographic recording medium comprises the polymeric chemically amplified resist of claim 30.

41. The lithographic process of claim 40, wherein the methacrylate component comprises methyl methacrylate, t-butyl methacrylate, methacrylic acid, or combinations thereof.

42. The lithographic process of claim 40, wherein the polymeric chemically amplified resist further comprises a dissolution promoter.

43. The lithographic process of claim 42, wherein the dissolution promoter comprises itaconic anhydride.

44. The lithographic process of claim 40, wherein the photoacid generating component comprises a sulfonium compound, an ionium compound, or combinations thereof.

45. An integrated circuit prepared by the lithographic process of claim 40.

46. The lithographic process of claim 40, wherein the radiation comprises extreme ultraviolet radiation.

47. The lithographic process of claim 40, wherein the radiation comprises X-ray radiation.

48. A polymeric chemically amplified resist comprising methyl methacrylate, t-butyl methacrylate, methacrylic acid, 3-(3,5,7,9,11,13,15-heptacyclopentylpentacyclo-[9.5.1.1$^{3,9}$.1$^{5,15}$.1$^{7,13}$]octasiloxane-1-yl)propyl methacrylate, and [p-CH$_2$=C(CH$_3$)C(O)OC$_6$H$_4$SMe$_2$]OSO$_2$CF$_3$.

49. The polymeric chemically amplified resist of claim 48, further comprising itaconic anhydride.

50. A polymeric lithographic resist comprising a photoacid generating component, wherein the photoacid generating component comprises [p-CH$_2$=C(CH$_3$)C(O)OC$_6$H$_4$SMe$_2$]OSO$_2$CF$_3$.

51. A polymeric resist comprising:
a polyhedral oligosilsesquioxane disilanol component; and
a polyacetal component.

52. The polymeric resist of claim 51, wherein the polyhedral oligosilsesquioxane disilanol component comprises disilanol cyclopentyl POSS (Si$_8$O$_{11}$(c-C$_5$H$_9$)$_8$(OH)$_2$), disilanol isobutyl POSS (Si$_8$O$_{11}$(i-C$_4$H$_9$)$_8$(OH)$_2$), or dimethylphenyldisilanol cyclopentyl POSS (Si$_8$O$_9$(c-C$_5$H$_9$)$_7$(OSiMe$_2$Ph)(OH)$_2$), or a combination thereof.

53. The polymeric resist of claim 51, wherein the polyacetal component comprises a polymer of a halogen-substituted ketone or aldehyde.

54. The polymeric resist of claim 51, wherein the polyacetal component comprises a polymer of hexafluoroacetone, trifluoroacetone, hexachloroacetone, trichloroacetone, trifluoroacetaldehyde, trichloroacetaldehyde, thiocarbonylfluoride, hexafluorothioacetone, mixtures thereof, or derivatives thereof.

55. A lithographic process comprising:
exposing a lithographic recording medium to radiation to form a pattern; and
developing the pattern;
wherein the lithographic recording medium comprises the polymeric resist of claim 51.

56. The lithographic process of claim 55, wherein the lithographic process comprises a 157 nm projection optical lithographic process.

57. An integrated circuit prepared by the lithographic process of claim 55.

58. A polymeric chemically amplified resist comprising:
a methacrylate component;
a polymerizable photoacid generating component; and
a polyhedral oligosilsesquioxane component.

59. The polymeric chemically amplified resist of claim 58, wherein the methacrylate component comprises methyl methacrylate, t-butyl methacrylate, methacrylic acid, or combinations thereof.

60. The polymeric chemically amplified resist of claim 58 further comprising a dissolution promoter.

61. The polymeric chemically amplified resist of claim 60 wherein the dissolution promoter comprises itaconic anhydride.

62. The polymeric chemically amplified resist of claim 58, wherein the photoacid generating component comprises a sulfonium compound, an ionium compound, or combinations thereof.

63. The polymeric chemically amplified resist of claim 58, wherein the photoacid generating component comprises [p-CH$_2$=C(CH$_3$)C(O)OC$_6$H$_4$SMe$_2$]OSO$_2$CF$_3$.

64. The polymeric chemically amplified resist of claim 58, wherein the polyhedral oligosilsesquioxane component comprises 3-(3,5,7,9,11,13,15-heptacyclopentylpentacyclo-[9.5.1.1$^{3,9}$.1$^{5,15}$.1$^{7,13}$]octasiloxane-1-yl)propyl methacrylate; 3-[(3,5,7,9,11,13,15-heptacyclopentylpentacyclo-[9.5.1.1$^{3,9}$.1$^{5,15}$.1$^{7,13}$]octasiloxan-1-yloxy)dimethylsilyl]propyl methacrylate; 1,3,5,7,9,11,13-heptacyclopentyl-15vinylpentacyclo-[9.5.1.1$^{3,9}$.1$^{5,15}$.1$^{7,13}$]octasiloxane, or combinations thereof.

65. The polymeric chemically amplified resist of claim 58, wherein the polymeric resist comprises about 1% to about 35% by weight of the polyhedral oligosilsesquioxane component.

66. The polymeric chemically amplified resist of claim 58, wherein the polymeric resist has a weight-average molecular weight between 20,000 to 100,000 g/mol.

67. The polymeric chemically amplified resist of claim 58, wherein the polymeric resist has a polydispersity index between 1 and about 2.

68. lithographic process comprising:
exposing a lithographic recording medium to radiation to form a pattern; and
developing the pattern;
wherein the lithographic recording medium comprises the polymeric chemically amplified resist of claim 58.

69. The lithographic process of claim 68, wherein the methacrylate component comprises methyl methacrylate, t-butyl methacrylate, methacrylic acid, or combinations thereof.

70. The lithographic process of claim 68, wherein the polymeric chemically amplified resist further comprises a dissolution promoter.

71. The lithographic process of claim 70, wherein the dissolution promoter comprises itaconic anhydride.

72. The lithographic process of claim 68, wherein the photoacid generating component comprises a sulfonium compound, an ionium compound, or combinations thereof.

73. An integrated circuit prepared by the lithographic process of claim 68.

74. The lithographic process of claim 68, wherein the radiation comprises extreme ultraviolet radiation.

75. The lithographic process of claim 68, wherein the radiation comprises X-ray radiation.

* * * * *